US007829982B2

United States Patent
Shirasaka et al.

(10) Patent No.: US 7,829,982 B2
(45) Date of Patent: Nov. 9, 2010

(54) LEAD FRAME, SENSOR INCLUDING LEAD FRAME AND METHOD OF FORMING SENSOR INCLUDING LEAD FRAME

(75) Inventors: Kenichi Shirasaka, Hamamatsu (JP); Hiroshi Saitoh, Iwata (JP)

(73) Assignee: Yamaha Corporation, Shizuoka-ken (JP)

( * ) Notice: Subject to any disclaimer, the term of this patent is extended or adjusted under 35 U.S.C. 154(b) by 875 days.

(21) Appl. No.: 11/355,175

(22) Filed: Feb. 16, 2006

(65) Prior Publication Data

US 2006/0186529 A1      Aug. 24, 2006

(30) Foreign Application Priority Data

Feb. 18, 2005  (JP)  ............... P2005-042133
Mar. 25, 2005  (JP)  ............... P2005-088180

(51) Int. Cl.
*H01L 23/495* (2006.01)

(52) U.S. Cl. ............. 257/666; 257/667; 257/692; 257/E23.031; 257/E23.046; 29/827; 29/857; 29/592; 361/807; 361/813; 438/123; 438/127; 438/48; 438/50; 73/493

(58) Field of Classification Search ......... 257/667, 257/676, 692, 784, 787, E23.031, E23.037, 257/E23.04, E23.046, E23.135; 438/50, 438/51, 106, 121–124; 73/493; 29/592, 29/592.1, 854, 827; 335/80

See application file for complete search history.

(56) References Cited

U.S. PATENT DOCUMENTS

| | | | |
|---|---|---|---|
| 6,212,783 | B1 | 4/2001 | Ott et al. |
| 2004/0103530 | A1 * | 6/2004 | Adachi et al. ............... 29/854 |

FOREIGN PATENT DOCUMENTS

| | | |
|---|---|---|
| EP | 0 481 806 | 4/1992 |
| JP | 05-291482 | 11/1993 |
| JP | 06-265569 | 9/1994 |
| JP | 07-225241 | 8/1995 |
| JP | 07-225242 | 8/1995 |
| JP | 07-273353 | 10/1995 |
| JP | 09-236616 | 9/1997 |
| JP | 09-292408 | 11/1997 |
| JP | 11-281666 | 10/1999 |
| JP | 2001-356154 | 12/2001 |
| JP | 2002-015204 | 1/2002 |
| JP | 2004-006752 | 1/2004 |
| JP | 2004-077374 | 3/2004 |
| JP | 2004-128473 | 4/2004 |

* cited by examiner

*Primary Examiner*—Lynne A Gurley
*Assistant Examiner*—Meiya Li
(74) *Attorney, Agent, or Firm*—Dickstein Shapiro LLP

(57) ABSTRACT

A lead frame includes a frame body defining an internal region, a plurality of leads extending from the frame body, and first and second stages that are disposed in the internal region. The first and second stages are sloped and are parallel to a first line along which a primary stream of a molten resin runs, so that slope angles of the stages are not substantially changed by the injection of the molten resin into the cavity.

11 Claims, 10 Drawing Sheets

LEAD FRAME, SENSOR INCLUDING LEAD FRAME AND METHOD OF FORMING SENSOR INCLUDING LEAD FRAME

BACKGROUND OF THE INVENTION

1. Field of the Invention

The present invention generally relates to a sensor for sensing the direction or the azimuth of a physical quantity such as a magnetic filed or gravity, a lead frame to be included in the sensor, and a method of manufacturing the sensor.

Priority is claimed on Japanese Patent Application No. 2005-42133, filed Feb. 18, 2005, and Japanese Patent Application No. 2005-88180, filed Mar. 25, 2005, the contents of which are incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In recent years, terminal devices have been developed such as mobile phones with a GPS (Global Positioning System) function, which indicates information about a user's position. The terminal device may have an additional function of sensing or measuring geomagnetic field or acceleration, thereby sensing or measuring the azimuth or direction in a three-dimensional space of a user's terminal device or a motion of the terminal device.

In order to provide the terminal device with the above-described additional function, it is necessary to integrate the terminal device with one or more sensors such as magnetic sensors or acceleration sensors. In order to allow the sensor to detect the azimuth or acceleration in the three-dimensional space, it is necessary for the sensors to be sloped so that a first one of the sensors tilts from a second one. The sensors are mounted on stages that are included in a lead frame. Thus, the stages are also sloped so that a first one of the stages tilts from a second one.

A wide variety of sensors that sense physical quantities have been developed. A typical example of the sensor may include, but is not limited to, a magnetic sensor that senses a magnetic field. This magnetic sensor is different from the above-described sensor. This magnetic sensor has a substrate and magnetic sensor chips that are disposed on a surface of the substrate. The magnetic sensor includes first and second magnetic sensor chips that are mounted on the substrate. The first magnetic sensor chip extends parallel to the surface of the substrate. The second magnetic sensor chip extends vertically to the surface of the substrate. The first magnetic sensor chip senses first and second magnetic components of an external magnetic field. The first magnetic component is a component in a first direction that is parallel to the surface of the substrate. The second magnetic component is another component in a second direction that is parallel to the surface of the substrate and is perpendicular to the first direction. The second magnetic sensor chip senses a third magnetic component of the external magnetic field. The third magnetic component is still another component in a third direction that is vertical to the surface of the substrate and also vertical to the first and second directions. The magnetic sensor utilizes a pair of the first and second magnetic sensor chips to detect a three-dimensional vector that represents the geomagnetic field. As described above, the second magnetic sensor chip extends vertically to the surface of the substrate. This increases a thickness of the magnetic sensor that includes the first and second magnetic sensors. The thickness is defined as a dimension or a size of the magnetic sensor in a direction vertical to the surface of the substrate.

In order to reduce the thickness of the magnetic sensor, it is effective and advantageous to dispose magnetic sensor chips on sloped stages that are sloped or tilted from the frame body. Japanese Unexamined Patent Application, First Publication, Nos. 9-292408, 2002-15204, and 2004-128473 disclose examples of the conventional sensor which includes a frame body, sloped stages, and sensor chips that are mounted on the sloped stages. Japanese Unexamined Patent Application, First Publication, No. 9-292408 discloses an acceleration sensor that includes a substrate and acceleration sensor chips that are sloped or tilted from a surface of the substrate, and a packaging that is placed on the substrate. The sloped sensor is highly sensitive to an acceleration in a direction that tilts from the surface of the substrate. The sloped sensor is poorly sensitive to another acceleration in another direction that is parallel to the surface of the substrate.

FIG. 17 is a plan view illustrating a conventional example of a lead frame to be used for forming a sensor that senses a physical quantity. FIG. 18 is a fragmentary cross sectional elevation view illustrating a sensor including the lead frame of FIG. 17. A lead frame 50 includes stages 55 and 57 that respectively support sensor chips 51 and 53, a frame body 59 that surrounds the stages 55 and 57, and connection portions 61 that connect the stages 55 and 57 to the frame body 59. This lead frame 50 is used to form a sensor. The stages 55 and 57 that respectively mount the sensor chips 51 and 53 are sloped from a plane that includes the frame body 59 and the connection portions 61. The lead frame 50 is placed in a cavity of dies "P" and "Q". A molten resin is injected into the cavity to form a resin mold that encapsulates the magnetic sensor chips 51 and 53 and the stages 55 and 57. In the injection molding process, the sloped stages 55 and 57 are pushed by flow of the molten resin when injected in the cavity, thereby making it possible to change slope angles of the stages 55 and 57. Substantive change of the slope angles of the stages makes it difficult for the sensor to perform a desired function of accurately sensing a physical quantity.

In view of the above, it will be apparent to those skilled in the art from this disclosure that there exists a need for an improved apparatus and/or method. This invention addresses this need in the art as well as other needs, which will become apparent to those skilled in the art from this disclosure.

SUMMARY OF THE INVENTION

Accordingly, it is a primary object of the present invention to provide a lead frame to be processed for forming a sensor that senses a physical quantity.

It is another object of the present invention to provide a lead frame included in a sensor that senses a physical quantity.

It is a further object of the present invention to provide a sensor that senses a physical quantity, wherein the sensor includes a lead frame.

It is a still further object of the present invention to provide a method of forming a lead frame to be included in a sensor that senses a physical quantity.

It is yet a further object of the present invention to provide a method of forming a sensor that senses a physical quantity, wherein the sensor includes a lead frame.

In accordance with a first aspect of the present invention, a lead frame includes a frame body, a plurality of leads, and first and second stages. The lead frame defines an internal region in which the first and second stages are disposed. The frame body extends in a first plane. The frame body has a first line that runs across the internal region. The internal region comprises first and second sub-regions that are bounded with each other by the first line. The plurality of leads extend from the frame body. The first stage is disposed in the first sub-region. The first stage is connected to the frame body. The first stage is distanced from the first line. The first stage extends in a second plane that is parallel to the first line. The second plane tilts from the first plane. The second stage is disposed in the second sub-region. The second stage is connected to the frame body. The second stage is distanced from the first line. The second stage extends in a third plane that is parallel to the first line. The third plane tilts from the first plane and the second plane. Sensor chips are mounted on the first and second stages. The lead frame is placed in a cavity of dies. A molten resin is injected into the cavity toward a direction that is aligned to the first line, so that the first and second stages are distanced from and not exposed to the primary stream of the molten resin when injected, thereby avoiding any substantive change to slope angles of the first and second stages.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

FIRST EMBODIMENT

Figure 1:
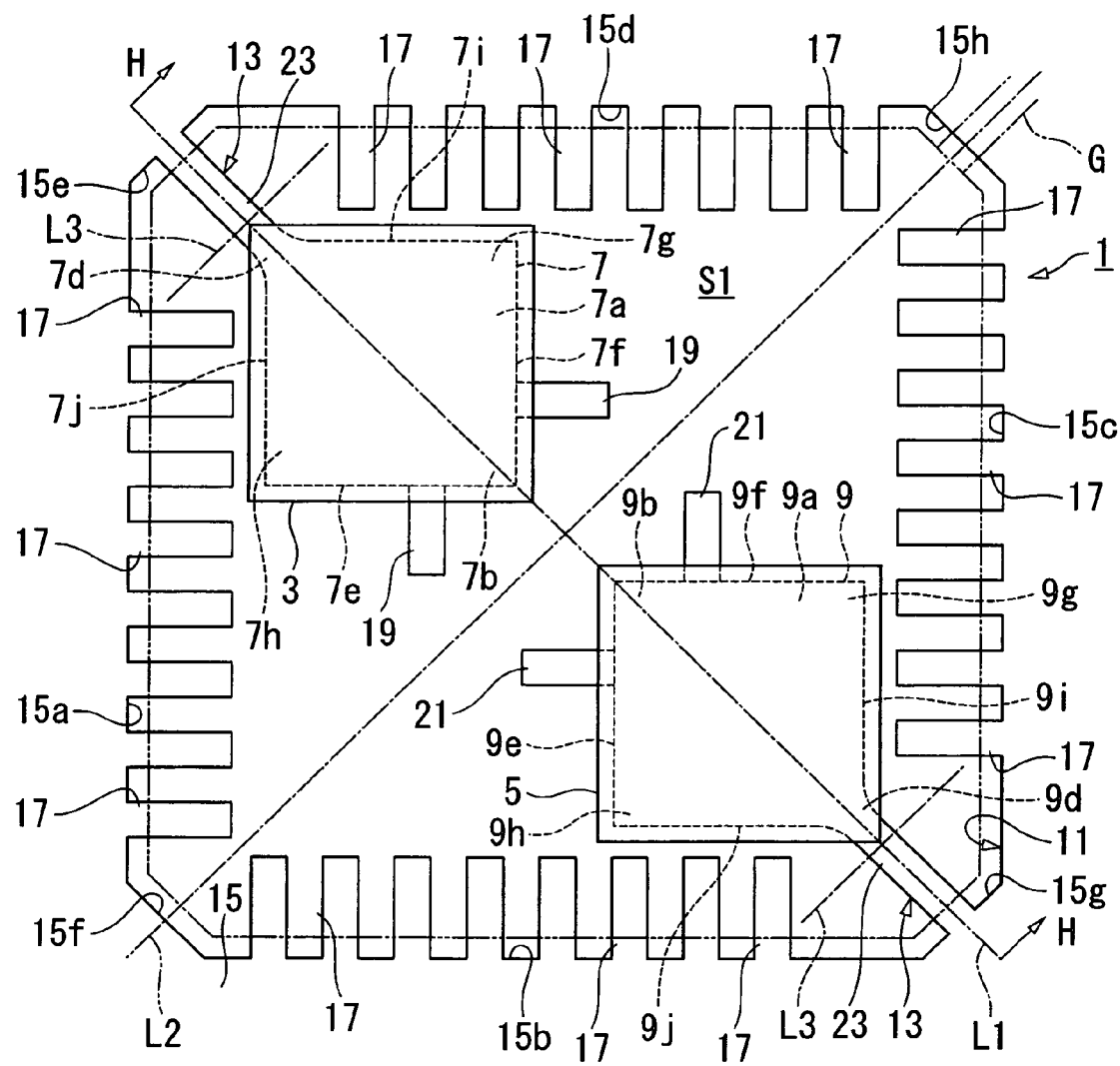
FIG. 1 is a plan view illustrating a lead frame with magnetic sensor chips in accordance with a first preferred embodiment of the present invention.
Figure 2:
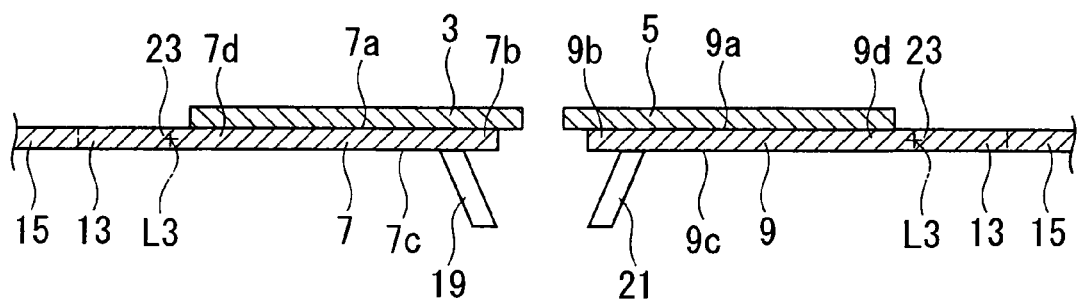
FIG. 2 is a cross sectional view of a lead frame, taken along an H-H line of FIG. 1.

FIG. 1 is a plan view illustrating a lead frame with magnetic sensor chips in accordance with a first preferred embodiment of the present invention. FIG. 2 is a cross sectional view of a lead frame, taken along an H-H line of FIG. 1. A sensor for sensing a physical quantity can be realized by a lead frame on which a plurality of sensor chips for sensing a physical quantity are mounted. A typical example of the sensor for sensing a physical quantity may include, but is not limited to, a magnetic sensor for sensing the direction and the magnitude of a magnetic field.

A magnetic sensor in accordance with this embodiment of the present invention comprises a lead frame 1 and two magnetic sensor chips 3, 5 that are mounted on the lead frame 1. Each of the two magnetic sensor chips 3, 5 measures the direction and the magnitude of an external magnetic field applied to the magnetic sensor. The lead frame 1 can be formed by processes for pressing and etching a metal plate such as a copper thin plate.

As shown in FIGS. 1 and 2, the lead frame 1 includes two stages 7 and 9 on which the magnetic sensor chips 3 and 5 are mounted, respectively. Each of the two stages 7 and 9 has a square shape in plan view. The lead frame 1 further includes a frame 11 that mechanically supports the two stages 7 and 9. The lead frame 1 furthermore includes connections 13, each of which mechanically inter-connects each of the stages 7 and 9 to the frame 11. The stages 7 and 9, the connections 13 and the frame 11 are integrated to form a monolithic structure.

The frame 11 further includes a square frame portion 15 and a plurality of leads 17. The square frame portion 15 has a generally square shape. For example, the square frame portion 15 has four sides 15a, 15b, 15c, and 15d, that define an internal region S1. Thus, the internal region S1 has a generally square shape. The stages 7 and 9 are positioned in the internal region S1. The square frame portion 15 encompasses the stages 7 and 9. The leads 17 extend inwardly from the four sides 15a, 15b, 15c, and 15d, of the square frame portion 15.

The plurality of leads 17 comprise first to fourth subpluralities of leads 17 that extend inwardly from the first to fourth sides 15a, 15b, 15c, and 15d, of the square frame portion 15, respectively. The leads 17 are electrically connected to bonding pads of the magnetic sensor chips 3 and 5. The bonding pads are not illustrated in the drawings.

The two stages 7 and 9 have surfaces 7a and 9a on which the magnetic sensor chips 3 and 5 are mounted, respectively. Each of the surfaces 7a and 9a has a generally square shape in plan view. The square frame portion 15 has first to fourth corners 15e, 15f, 15g and 15h. The first side 15a extends between the first and second corners 15e and 15f. The second side 15b extends between the second and third corners 15f and 15g. The third side 15c extends between the third and fourth corners 15g and 15h. The fourth side 15d extends between the fourth and first corners 15h and 15e. The square frame portion 15 further has a first surface 15i and a second surface 15j that is opposite to the first surface 15i.

The square frame portion 15 defines first and second diagonal lines L1 and L2 that cross each other at a right angle. The first diagonal line L1 extends between the first and third corners 15e and 15g. The second diagonal line L2 extends between the second and fourth corners 15f and 15h. The first and third corners 15e and 15g are positioned symmetrically to each other with reference to the reflection-symmetric axis of the second diagonal line L2. The second and fourth corners 15f and 15h are positioned symmetrically to each other with reference to the reflection-symmetric axis of the first diagonal line L1. The stages 7 and 9 are positioned near the first and third corners 15e and 15g, respectively. The stages 7 and 9 have diagonal lines which overlap the first diagonal line L1. The stages 7 and 9 are placed at positions that are symmetrical to each other with reference to the reflection-symmetric axis of the second diagonal line L2. The stages 7 and 9 are disposed symmetrically to each other with reference to the reflection-symmetric axis of the second diagonal line L2. The stages 7 and 9 are distanced from the second diagonal line L2. Each of the stages 7 and 9 extends two-dimensionally and symmetrically with reference to the reflection-symmetric axis of the first diagonal line L1.

As shown in FIG. 2, the stage 7 has the first surface 7a and a second surface 7c that is opposite to the first surface 7a. The stage 7 further has first to fourth corners 7d, 7g, 7b and 7h, and first to fourth sides 7i, 7f, 7e and 7j. The first and third corners 7d and 7b are positioned on the first diagonal line L1. The second and fourth corners 7g and 7h are positioned symmetrically to each other with reference to the reflection-symmetric axis of the first diagonal line L1. The first side 7i extends between the first and second corners 7d and 7g. The second side 7f extends between the second and third corners 7g and 7b. The third side 7e extends between the third and fourth corners 7b and 7h. The fourth side 7j extends between the fourth and first corners 7h and 7d. Two projecting parts 19 extend from the bottom surface 7c in a direction vertical to a plane that includes the first and second diagonal lines L1 and L2. Preferably, the projecting parts 19 extend from positions adjacent to the second side 7f and the third side 7e, respectively. The paired projecting parts 19 are positioned symmetrically to each other with reference to the reflection-symmetric axis of the first diagonal line L1. The first corner 7d is positioned near the first corner 15e, while the third corner 7d is distal from the first corner 15e.

As shown in FIG. 2, the stage 9 has the first surface 9a and a second surface 9c that is opposite to the first surface 9a. The stage 9 further has first to fourth corners 9d, 9g, 9b and 9h, and first to fourth sides 9i, 9f, 9e and 9j. The first and third corners 9d and 9b are positioned on the first diagonal line L1. The second and fourth corners 9g and 9h are positioned symmetrically to each other with reference to the reflection-symmetric axis of the first diagonal line L1. The first side 9i extends between the first and second corners 9d and 9g. The second side 9f extends between the second and third corners 9g and 9b. The third side 9e extends between the third and fourth corners 9b and 9h. The fourth side 9j extends between the fourth and first corners 9h and 9d. Two projecting parts 21 extend from the bottom surface 9c in the direction vertical to the plane that includes the first and second diagonal lines L1 and L2. Preferably, the projecting parts 21 extend from positions adjacent to the second side 9f and the third side 9e, respectively. The paired projecting parts 21 are positioned symmetrically to each other with reference to the reflection-symmetric axis of the first diagonal line L1. The first corner 9d is positioned near the third corner 15g, while the third corner 9d is distal from the third corner 15g.

A first one of the connections 13 extends along the first diagonal line L1 from the first corner 15e of the square frame portion 15 to the first corner 7d of the stage 7, so that the stage 7 is connected through the connection 13 to the first corner 15e of the square frame portion 15. A second one of the connections 13 also extends along the first diagonal line L1 from the third corner 15g of the square frame portion 15 to the first corner 9d of the stage 9, so that the stage 9 is connected through the connection 13 to the third corner 15g of the square frame portion 15.

Each of the connections 13 has a flexible portion 23 that is easily deformable so as to allow each of the stages 7 and 9 to become declined or sloped down from the plane that includes the first and second diagonal lines L1 and L2, upon receipt of an application of an external force in a process to be described later. The connections 13 are bendable at reference axial lines L3 that extend perpendicular to the first diagonal line L1 and extend parallel to the second diagonal line L2. The flexible portion 23 of the connection 13 is allowed to be bent on the reference axial line L3, so that the third corner 7b moves in the direction vertical to the plane that includes the first and second diagonal lines L1 and L2, whereby the third corner 7b becomes different in level from the first corner 7d, and the stage 7 becomes declined or sloped down with reference to the reference axial line L3. Also, the flexible portion 23 of the connection 13 is allowed to be bent on the reference axial line L3, so that the third corner 9b moves in the vertical direction, whereby the third corner 9b becomes different in level from the first corner 9d, and the stage 9 becomes declined or sloped down with reference to the reference axial line L3.

Figure 3:
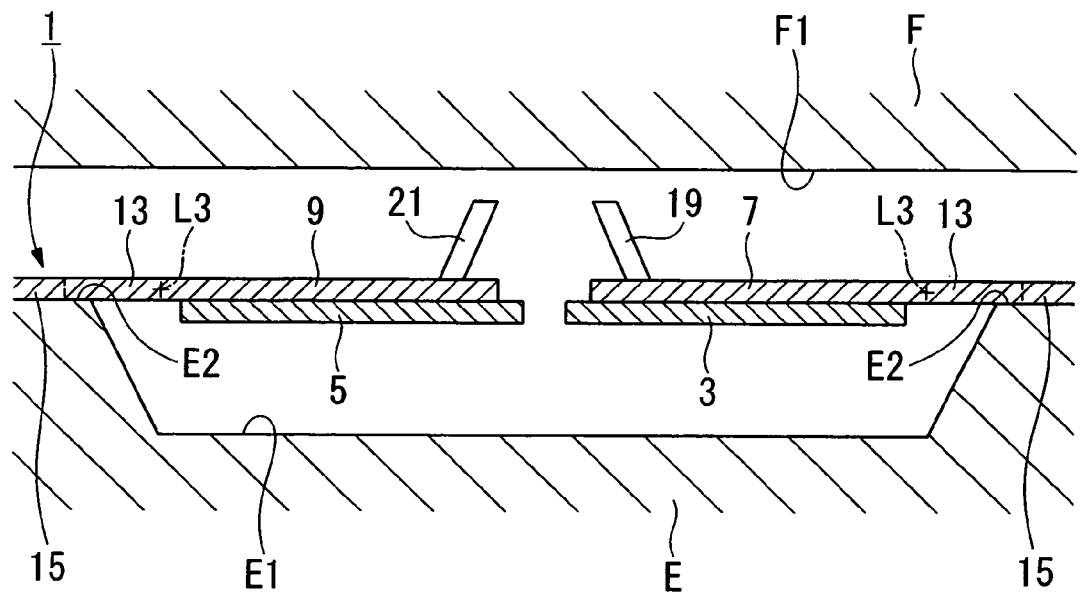
FIG. 3 is a fragmentary cross sectional elevation view illustrating the lead frame in a step involved in a method of forming the magnetic sensor by using the lead frame of FIG. 1 in accordance with the first embodiment of the present invention.
Figure 4:
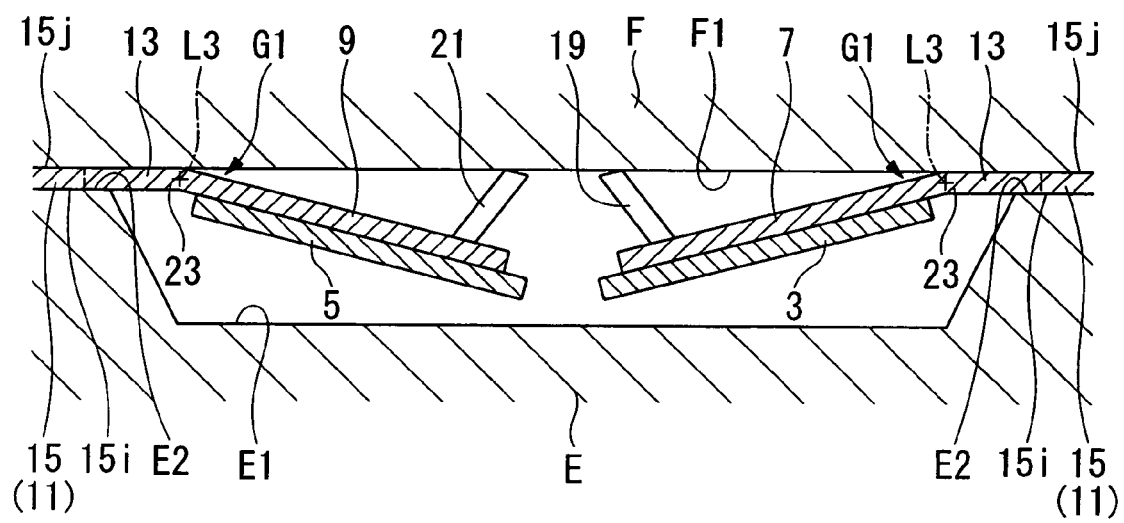
FIG. 4 is a fragmentary cross sectional elevation view illustrating the lead frame in another step involved in the method of forming the magnetic sensor by using the lead frame of FIG. 1 in accordance with the first embodiment of the present invention.

A method of forming a magnetic sensor using the above-described lead frame 1 of FIG. 1 will be described. FIG. 3 is a fragmentary cross sectional elevation view illustrating the lead frame in a step involved in a method of forming the magnetic sensor by using the lead frame of FIG. 1 in accordance with the first embodiment of the present invention. FIG. 4 is a fragmentary cross sectional elevation view illustrating the lead frame in another step involved in the method of forming the magnetic sensor by using the lead frame of FIG. 1 in accordance with the first embodiment of the present invention.

In the first step, the lead frame 1 described above with reference to FIGS. 1 and 2 is prepared. In the second step, the magnetic sensor chips 3 and 5 are bonded to the first surfaces 7a and 9a of the stages 7 and 9, respectively. In the third step, the leads 17 of the lead frame 1 are electrically connected through wirings to bonding pads that are provided on each of the magnetic sensor chips 3 and 5. The bonding pads are not illustrated in the drawings. The wirings can advantageously be flexible so as to allow the stages. 7 and 9 to be sloped down or declined in a later process for bending the flexible portions 23 of the connections 13, thereby changing relative positions of the bonding pads of the magnetic sensor chips 3 and 5 with reference to the lead frames 17.

With reference to FIG. 3, first and second dies "E" and "F" are prepared. The first die "E" has a concave "E1" and a peripheral ridge "E2". The second die "F" has a flat surface "F1". The concave "E1" and the flat surface "F1" define a cavity of the dies "E" and "F". The lead frame 1 is placed on the first die "E", wherein the square frame portion 15 is in contact with the peripheral ridge "E2". The leads 17, the magnetic sensor chips 3 and 5, the stages 7 and 9, the connections 13 and the projecting parts 19 and 21 are positioned over the concave "E1" of the first die "E". When the lead frame 1 is placed on the first die "E", the magnetic sensor chips 3 and 5 are positioned under the stages 7 and 9, and the projecting parts 19 and 21 extend upwardly from the second surfaces 7c and 9c of the stages 7 and 9, respectively. The magnetic sensor chips 3 and 5 are distanced by a gap from the concave "E1" of the first die "E". The projecting parts 19 and 21 are also distanced by another gap from the flat surface "F1".

With reference to FIG. 4, the second die "F" moves toward the first die "E", so that the flat surface "F1" presses down the projecting parts 19 and 21 until the first and second dies "E" and "F" sandwich the square frame portion 15 of the lead frame 1, whereby the connections 13 are bent on the reference axial lines L3, and the stages 7 and 9 are sloped down or declined from the above-described plane that includes the first and second diagonal lines L1 and L2. Since the square frame portion 15 extends two-dimensionally in the plane that includes the first and second diagonal lines L1 and L2, the plane also includes the square frame portion 15. The magnetic sensor chips 3 and 5 which are respectively mounted on the stages 7 and 9 are also sloped down or declined together with the stages 7 and 9. The sloped magnetic sensor chips 3 and 5 have a predetermined slope angle with reference to the square frame portion 15 and to the flat surface "F1". The predetermined slope angle is determined by the projecting parts 19 and 21. For example, the predetermined slope angle is determined by a distance between the reference axial line L3 and each of the projecting parts 19 and 21 and by a dimension or size of each of the projecting parts 19 and 21, wherein the dimension is defined in a direction vertical to the plane that includes each of the projecting parts 19 and 21. When the first and second dies "E" and "F" sandwich the square frame portion 15, the first surface 15i of the square frame portion 15 is in contact with the peripheral ridge "E2" of the first die "E", while the second surface 15j of the square frame portion 15 is in contact with the flat surface "F1".

A molten resin is injected into the cavity of the dies "E" and "F" with the second die "F" continuing to hold down the projecting parts 19 and 21, whereby the magnetic sensor chips 3 and 5 and the stages 7 and 9 are molded and sealed with the resin. As described above, the cavity is defined by the concave "E1" of the first die "E" and the flat surface "F1" of the second die "F".

In the injection-molding process, the molten resin is injected into the cavity through a gate "G" shown in FIG. 1. The gate "G" is positioned on the second diagonal line L2 and at the fourth corner 15h of the square frame portion 15 of the lead frame 1. In the cavity, the molten resin when injected will flow with a spread toward the first, second and third corners 15e, 15f and 15g and the first and second sides 15a and 15b. This flow of the molten resin will include a primary stream toward the second corner 15f opposing to the gate "G" and secondary streams toward the first and second sides 15a and 15b and the first and third corners 15e and 15g. The secondary streams are caused by the spread from the primary stream. The primary stream of the molten resin will run along the second diagonal line L2. As described above, the reference axial lines L3 at which the flexible portions 23 of the connections 13 are bent are parallel to the second diagonal line L2. The reference axial line L3 is parallel to the second diagonal line L2. Thus, the primary stream that runs along the second diagonal line L2 will be directed in parallel to the reference axial lines L3. The first and second surfaces 7a and 7c of the sloped or declined stage 7 are parallel to the second diagonal line L2. The first and second surfaces 9a and 9c of the sloped or declined stage 9 are also parallel to the second diagonal line L2. The sloped or declined magnetic sensor chips 3 and 5 which are respectively mounted on the sloped or declined stages 7 and 9 are also parallel to the second diagonal line L2. Accordingly, the primary stream of the molten resin will be directed in parallel to the sloped or declined stages 7 and 9 and to the sloped or declined magnetic sensor chips 3 and 5. This means that the primary stream of the molten resin can not be disturbed substantially by the presence of the sloped stages 7 and 9 and the sloped magnetic sensor chips 3 and 5. Further, the primary stream of the molten resin can not push substantially the sloped stages 7 and 9 and the sloped magnetic sensor chips 3 and 5.

As shown in FIG. 4, when the first and second dies "E" and "F" sandwich the square frame portion 15, the flat surface "F1" of the second die "F" is in contact with the second surface 15j of the square frame portion 15. The first corners 7a and 9a of the stages 7 and 9 are distanced by small gaps G1 from the flat surface "F1" of the second die "F". Since the primary stream of the molten resin can not be disturbed substantially by the stages 7 and 9 as described above, the molten resin can fill up the small gaps G1 without receiving any substantive disturbance by the stages 7 and 9. Preferably, the resin has a high fluidity in order to prevent the flow of the molten resin when injected in the cavity from changing the slope angle of the sloped stages 7 and 9 and the sloped magnetic sensor chips 3 and 5.

Figure 5:
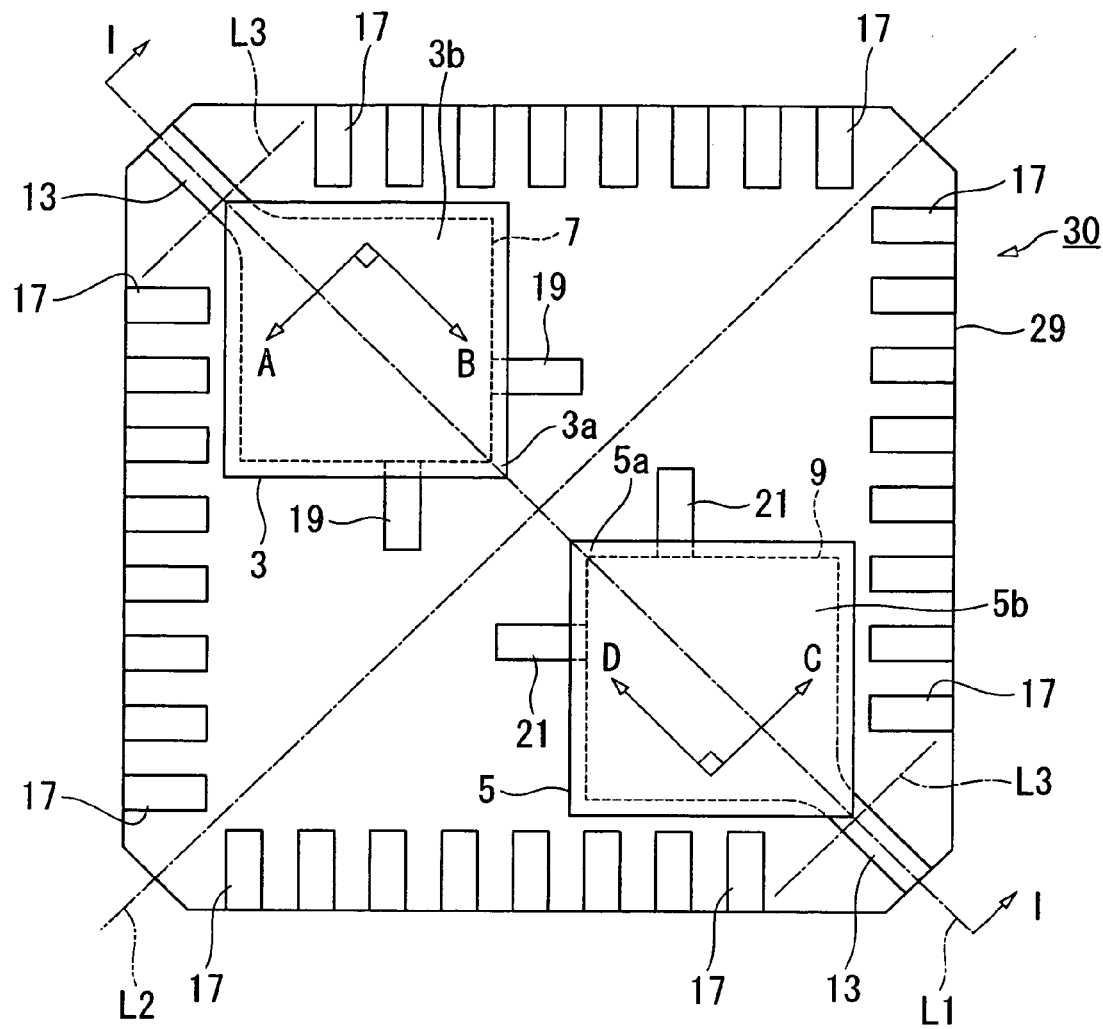
FIG. 5 is a plan view illustrating a magnetic sensor formed by using the lead frame of FIG. 1.
Figure 6:
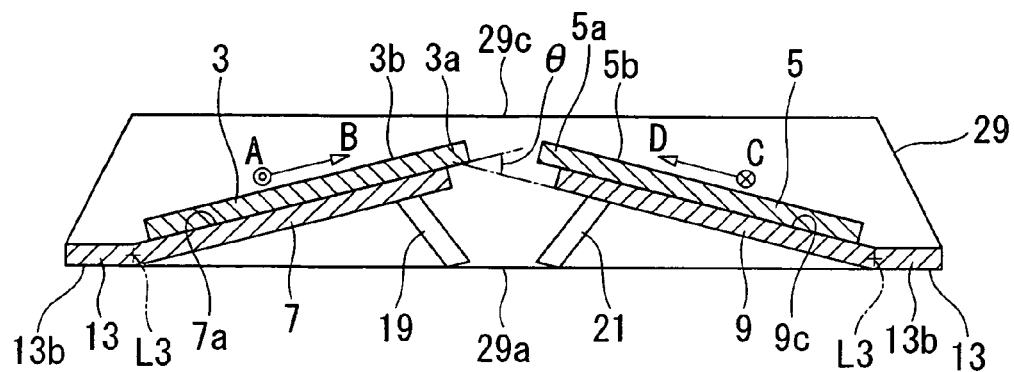
FIG. 6 is a cross sectional elevation view taken along an I-I line of FIG. 5 illustrating the magnetic sensor.

FIG. 5 is a plan view illustrating a magnetic sensor formed by using the lead frame 1 of FIG. 1. FIG. 6 is a cross sectional elevation view taken along an I-I line of FIG. 5 illustrating the magnetic sensor. In the above-described process for molding the lead frame 1, the sloped magnetic sensor chips 3 and 5 on the sloped stages 7 and 9 are sealed with the molten resin when injected into the cavity. The molten resin is then cooled and solidified to form a resin mold 29. As shown in FIGS. 5 and 6, through the molding process, the sloped magnetic sensor chips 3 and 5 on the sloped stages 7 and 9 are encapsulated and sealed with the resin mold 29. The sloped magnetic sensor chips 3 and 5 are fixed in the resin mold 29, while the square frame portion 15 extends outside the resin mold 29.

The square frame portion 15 outside the resin mold 29 is then cut off and removed from the resin mold 29. The outside portions of the connections 13 and the leads 17 are detruncated and removed from the resin mold 29, thereby completing a magnetic sensor 30.

The magnetic sensor 30 includes the sloped magnetic sensor chips 3 and 5, the sloped stages 7 and 9, the projecting parts 19 and 21, remaining portions of the leads 17, remaining portions of the connections 13, and the resin mold 29 that seals and encapsulates those elements. The resin mold 29 has a generally square shape in plan view. The resin mold 29 further has a flat bottom surface 29a and a flat top surface 29c. The connections 13 have surfaces 13b that are leveled to and shown in the flat bottom surface 29a. The projecting parts 19 and 21 have tops that are leveled to and shown in the flat bottom surface 29a. The leads 17 are connected to the sloped magnetic sensor chips 3 and 5 through wirings that are not illustrated. The wirings are also sealed and encapsulated by the resin mold 29.

The sloped magnetic sensor chips 3 and 5 are buried in the resin mold 29, wherein the sloped magnetic sensor chips 3 and 5 tilt from the flat bottom surface 29a of the resin mold 29. The sloped magnetic sensor chips 3 and 5 are included in two sloped planes that cross each other at an acute angle θ. Namely, the sloped magnetic sensor chips 3 and 5 have sloped angles that are different from each other by the acute angle θ. This angle θ is shown in FIG. 6 and is different from the above-described slope angle. Since the magnetic sensor chips 3 and 5 are mounted on the sloped stages 7 and 9, the sloped angles 7 and 9 are also included in two sloped planes that cross each other at the acute angle θ. Namely, the sloped stages 7 and 9 have sloped angles that are different from each other by the acute angle θ.

Each of the sloped magnetic sensor chips 3 and 5 is configured to sense two components of an external magnetic field applied to the magnetic sensor 30. The directions of the two components are perpendicular to each other but both are parallel to the sloped plane including the sloped magnetic sensor chip 3 or 5. For example, in FIG. 6, the sloped magnetic sensor chip 3 senses a first component of the external magnetic field in a first direction marked by an arrow "A" and a second component of the external magnetic field in a second direction marked by an arrow "B". The first and second directions "A" and "B" are perpendicular to each other but both are parallel to the first sloped plane including the sloped magnetic sensor chip 3. The sloped magnetic sensor chip 5 senses a third component of the external magnetic field in a third direction marked by an arrow "C" and a fourth component of the external magnetic field in a fourth direction marked by an arrow "D". The third and fourth directions "C" and "D" are perpendicular to each other but both are parallel to the second sloped plane including the sloped magnetic sensor chip 5. The first and third directions "A" and "C" are anti-parallel to each other and both are perpendicular to the first diagonal line L1 and parallel to the second diagonal line L2. The second and fourth directions "B" and "D" are different from each other by the acute angle θ and both are perpendicular to the second diagonal line L2.

The first sloped plane that is parallel to the first and second directions "A" and "B" and the second sloped plane that is parallel to the first and second directions "C" and "D" cross each other at the above-described acute angle θ. This acute angle θ may theoretically be greater than 0 degree and at most 90 degrees, to enable the magnetic sensor 30 to sense accurately the azimuth of three-dimensional geomagnetism. The acute angle θ is preferably in the range of 20 degrees to 90 degrees, and more preferably in the range of 30 degrees to 90 degrees.

The magnetic sensor 30 may advantageously be integrated or mounted on a circuit board that is included in a device such as a mobile terminal. A typical example of the mobile terminal may include, but is not limited to, a cellular phone. When the magnetic sensor 30 is integrated in the cellular phone, it is advantageously possible for the magnetic sensor 30 to sense the azimuth of geomagnetism and display it on a display panel of the cellular phone.

In accordance with the above-described embodiment, the sloped stages 7 and 9 and the sloped magnetic sensor chips 3 and 5 are distanced from the second diagonal line L2 along which the primary stream of the molten resin when injected runs in the above-described injection molding process. Thus, the primary stream of the molten resin when injected in the cavity can not push substantially the sloped stages 7 and 9 and the sloped magnetic sensor chips 3 and 5, thereby causing substantially no changes to the slope angles of the magnetic sensor chips 3 and 5. Substantially no changes to the slope angles of the magnetic sensor chips 3 and 5 cause substantially no change to the above-described acute angle defined between the sloped magnetic sensor chips 3 and 5.

Since the primary stream of the molten resin can not be disturbed substantially by the stages 7 and 9 as described above, the molten resin can fill up the above-described small gaps G1 shown in FIG. 4. This contributes to avoid the formation of any void in the resin mold 29.

As described above, the stages 7 and 9 of the lead frame 1 are connected through the connections 13 to the first and third corners 15e and 15g of the square frame portion 15. The first and third corners 15e and 15g are distanced from the second diagonal line L2 along which the primary stream of the molten resin runs. This means that the first and third corners 15e and 15g are not exposed to the primary stream of the molten resin, but may be exposed to the secondary streams of the molten resin. The stages 7 and 9 are also distanced from the second diagonal line L2 along which the primary stream of the molten resin runs. This means that the stages 7 and 9 are not exposed to the primary stream of the molten resin, but may be exposed to the secondary streams of the molten resin. The secondary streams of the molten resin might further include no or a weak sub-stream that will push weakly the sloped stages 7 and 9 and the sloped magnetic sensor chips 3 and 5. Further, the secondary streams of the molten resin are lower in power than the primary stream. Therefore, the secondary streams can provide substantially no or a weak pushing forces to the sloped stages 7 and 9 and the sloped magnetic sensor chips 3 and 5. This means that the flow of the molten resin can cause substantially no change or a small change to the slope angle of the magnetic sensor chips 3 and 5.

In accordance with the above-described embodiment, the molten resin is supplied into the cavity through the gate "G" that is positioned at the fourth corner 15h. Notwithstanding, it is possible as a modification that the gate "G" is provided at the second corner 15f that is positioned on the second diagonal line L2, so that the molten resin is injected from the second corner 15f toward the fourth corner 15h, so as to cause the primary stream of the molten resin to flow along the second diagonal line L2.

In accordance with the above-described embodiment, the stages 7 and 9 are disposed on the first diagonal line L1, and the reference axial lines L3 are parallel to the second diagonal line L2 that is perpendicular to the first diagonal line L1. If it were unnecessary to completely fill up the small gaps G1 with the molten resin is not taken into account, the stages 7 and 9 can be disposed at positions that are symmetrical to each other with reference to the reflection-symmetric axis of the second diagonal line L2 along which the primary stream of the molten resin runs. Thus, the magnetic sensor chips 3 and 5 can be positioned symmetrically to each other with reference to the reflection-symmetric axis of the second diagonal line L2. A typical example of possible modifications to the lead frame 1 of FIG. 1 will be described with reference to the drawings.

Figure 7:
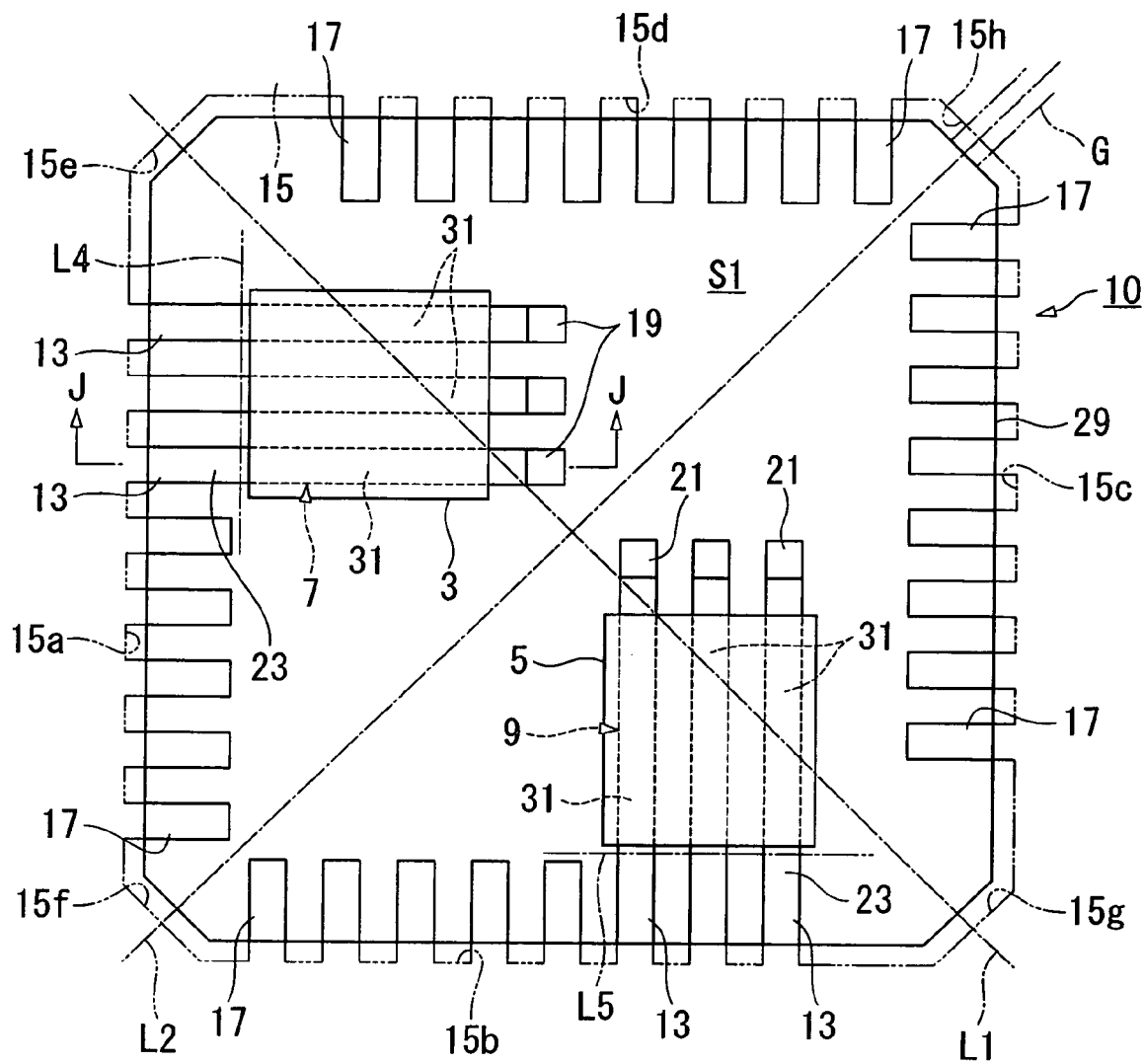
FIG. 7 is a plan view illustrating a modified lead frame with magnetic sensors in accordance with a modified example of the first preferred embodiment of the present invention.
Figure 8:
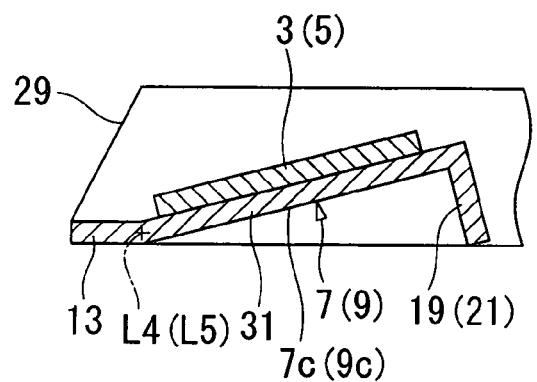
FIG. 8 is a fragmentary cross sectional elevation view, taken along a J-J line of FIG. 7 illustrating a modified lead frame.

FIG. 7 is a plan view illustrating a modified lead frame with magnetic sensors in accordance with a modified example of the first preferred embodiment of the present invention. FIG. 8 is a fragmentary cross sectional elevation view, taken along a J-J line of FIG. 7 illustrating a modified lead frame. The modified example of the first preferred embodiment provides a modified lead frame 10. The following descriptions will be made to highlight differences of the modified lead frame 10 of FIG. 7 from the above-described lead frame 1 of FIG. 1.

As shown in FIG. 7, the modified lead frame 10 includes the two stages 7 and 9 that are disposed symmetrically to each other with reference to the reflection-symmetric axis of the second diagonal line L2, provided that each of the stages 7 and 9 extends asymmetrically with reference to the reflection-symmetric axis of the first diagonal line L1. The modified lead frame 10 further includes the magnetic sensor chips 3 and 5 that are mounted on the stages 7 and 9, respectively. The magnetic sensor chips 3 and 5 are also disposed symmetrically to each other with reference to the reflection-symmetric axis of the second diagonal line L2, provided that each of the magnetic sensor chips 3 and 5 extends asymmetrically with reference to the reflection-symmetric axis of the first diagonal line L1.

The plurality of leads 17 comprise first to fourth sub-pluralities of leads 17 that extend inwardly from the first to fourth sides 15a, 15b, 15c, and 15d of the square frame portion 15, respectively. A first plurality of modified leads extend inwardly from the first side 15a of the square frame portion 15. Namely, the first plurality of modified leads and the first sub-plurality of leads 17 are aligned at a constant pitch along the direction parallel to the first side 15a of the square frame portion 15. The first plurality of modified leads are longer than the leads 17, so that the first plurality of modified leads extend across the first diagonal line L1, but do not extend across the second diagonal line L2. A second plurality of modified leads extend inwardly from the second side 15b of the square frame portion 15. Namely, the second plurality of modified leads and the second sub-plurality of leads 17 are aligned at a constant pitch along the direction parallel to the second side 15b of the square frame portion 15. The second plurality of modified leads are longer than the leads 17, so that the second plurality of modified leads extend across the first diagonal line L1, but do not extend across the second diagonal line L2.

Each of the modified leads comprises a first portion and a second portion 31. The first portion extends between the second portion 31 and the first or second side 15a or 15b, respectively, of the square frame portion 15. The second portion 31 is connected through the first portion to the first or second side 15a or 15b of the square frame portion 15. The first portion composes a connection 13 that connects the stage 7 or 9 to the first or second side 15a or 15b of the square frame portion 15. The second portion 31 composes a part of the stage 7 or 9. A first plurality of the first portions of the modified leads which extend from the first side 15a serve as a first plurality of connections 13 that extend inwardly from the first side 15a. The first plurality of connections 13 connect the stage 7 to the first side 15a. A second plurality of the first portions of the modified leads which extend from the second side 15b serve as a second plurality of connections 13 that extend inwardly from the second side 15b. The second plurality of connections 13 connect the stage 9 to the second side 15b.

The stage 7 comprises a first plurality of the second portions 31 of the modified leads which extend from the first side 15a. The stage 7 is connected through the connections 13 to the first side 15a. The magnetic sensor chip 3 is mounted on the second portions of the modified leads which extend from the first side 15a. The stage 9 comprises a second plurality of the second portions 31 of the modified leads which extend from the second side 15b. The stage 9 is connected through the connections 13 to the second side 15b. The magnetic sensor chip S is mounted on the second portions 31 of the modified leads which extend from the second side 15b.

The connections 13 which extend from the first side 15a include flexible portions 23 that have a reference axial line L4 that is parallel to the first side 15a. The connections 13 are bendable at the reference axial line L4. The reference axial line L4 is neither parallel to nor perpendicular to the first and second diagonal lines L1 and L2. The connections 13 which extend from the second side 15b include flexible portions 23 that have a reference axial line L5 that is parallel to the second side 1b. The connections 13 are bendable at the reference axial line L5. The reference axial line L5 is neither parallel to nor perpendicular to each of the first and second diagonal lines L1 and L2. The reference axial line L4 is perpendicular to the reference axial line L5.

The second portions 31 of the modified leads which extend from the first side 15a have ends from which projecting parts 19 extend in a direction vertical to the plane that includes the first and second diagonal lines L1 and L2. For example, the projecting parts 19 extend opposite to the magnetic sensor chip 3. The second portions 31 of the modified leads which extend from the second side 15b have ends from which projecting parts 21 extend in the direction vertical to the plane that includes the first and second diagonal lines L1 and L2. For example, the projecting parts 21 extend opposite to the magnetic sensor chip 5.

As described above, the stages 7 and 9 are distanced from the second diagonal line L2 along which the primary stream of the molten resin runs in the injection molding process. This means that the stages 7 and 9 are not exposed to the primary stream of the molten resin, but may be exposed to the secondary streams of the molten resin. The secondary streams of the molten resin might further include no or a weak sub-stream that will push weakly the sloped stages 7 and 9 and the sloped magnetic sensor chips 3 and 5. Further, the secondary streams of the molten resin are lower in power than the primary stream. Therefore, the secondary streams can provide substantially no or a weak pushing forces to the sloped stages 7 and 9 and the sloped magnetic sensor chips 3 and 5. This means that the flow of the molten resin can cause substantially no change or a small change to the slope angle of the magnetic sensor chips 3 and 5.

In the injection molding process, the second die "F" moves toward the first die "E", so that the flat surface "F1" presses down the projecting parts 19 and 21 until the first and second dies "E" and "F" sandwich the square frame portion 15 of the lead frame 1, whereby the connections 13 are bent on the reference axial lines L4 and L5, and the stages 7 and 9 are sloped down or declined from the plane that includes the first and second diagonal lines L1 and L2. The magnetic sensor chips 3 and 5 which are respectively mounted on the stages 7 and 9 are also sloped down or declined together with the stages 7 and 9.

In the injection-molding process, the molten resin is injected into the cavity through a gate "G" shown in FIG. 7. The gate "G" is positioned on the second diagonal line L2 and at the fourth corner 15h of the square frame portion 15 of the lead frame 1. In the cavity, the flow of the molten resin will include a primary stream toward the second corner 15f opposing to the gate "G" and secondary streams toward the first and second sides 15a and 15b and the first and third corners 15e and 15g. The secondary streams are caused by the spread from the primary stream. The primary stream of the molten resin will run along the second diagonal line L2. The connections 13 between the first side 15a and the stage 7 are bent on the reference axial lines L4 that are parallel to the first side 15a. As described above, however, the stage 7 and the magnetic sensor chip 3 are distanced from the second diagonal line L2 along which the primary stream of the molten resin runs in the injection molding process. The primary stream of the molten resin when injected in the cavity can not push the sloped stages 7 and 9 and the sloped magnetic sensor chips 3 and 5, while the secondary streams can push, but weakly, the sloped stages 7 and 9 and the sloped magnetic sensor chips 3 and 5. This prevents the slope angle of the magnetic sensor chips 3 and 5 from being largely changed by the primary stream of the molten resin, but this may allow the slope angle to be slightly changed by the secondary streams. Substantially no or a slight change to the slope angle of the magnetic sensor chips 3 and 5 causes substantially no or a slight change to the acute angle defined between the sloped magnetic sensor chips 3 and 5. This slight possible change to the acute angle increases, but not decreases, the acute angle because the secondary streams of the molten resin can push weakly the stages 7 and 9 so as to increase slightly the slope angle of the stages 7 and 9. The stages 7 and 9 with the magnetic sensor chips 3 and 5 are not exposed to the primary stream of the molten resin. This allows the magnetic sensor to sense accurately the azimuth of three-dimensional geomagnetism.

In accordance with the first embodiment, the stages 7 and 9 are advantageously positioned symmetrically to each other with reference to the reflection-symmetric axis of the second diagonal line L2 along which the primary stream of the molten resin will run in the injection molding process. It is possible as another typical example for the stages 7 and 9 to be connected to the first and second sides 15a and 15b that are adjacent to the second corner 15f toward which the primary stream of the molten resin flows from the gate "G" of the fourth corner 15h, regardless of whether the stages 7 and 9 are positioned symmetrically or asymmetrically to each other with reference to the reflection-symmetric axis of the second diagonal line L2. This configuration provides substantially the same effects and advantages as described above. It is also possible as still another typical example for the stages 7 and 9 to be connected to the first and third corners 15e and 15g that are distal from the second diagonal line L2 along which the primary stream of the molten resin will run, regardless of whether the stages 7 and 9 are positioned symmetrically or asymmetrically to each other with reference to the reflection-symmetric axis of the second diagonal line L2. This configuration provides substantially the same effects and advantages as described above.

In accordance with the first embodiment, the primary stream of the molten resin runs along the second diagonal line L2, and the stages 7 and 9 are distanced from the second diagonal line L2. It is possible as a modification for the stages 7 and 9 to be distanced from a primary stream line along which the primary stream of the molten resin will run in the injection molding process, so as to prevent the stages 7 and 9 from being exposed to the primary stream, regardless of whether the primary stream line is aligned to or displaced from the second diagonal line L2. It is advantageously possible for the stages 7 and 9 to be distanced from the primary stream line and to. be positioned symmetrically to each other with reference to the reflection-symmetric axis of the primary stream line.

In accordance with the first embodiment, the projecting parts 19 and 21 extend from the peripheries or the ends of the stages 7 and 9. It is possible that the projecting parts 19 and 21 extend from the bottom surfaces of the stages 7 and 9, regardless of the exact positions from which the projecting parts 19 and 21 extend.

In accordance with the first embodiment, the projecting parts 19 and 21 are used to slope or decline the stages 7 and 9. It is possible as a modification that none of the projecting parts 19 and 21 are needed, provided that the stages 7 and 9 with the magnetic sensor chips 3 and 5 have already been sloped or declined by the known or available technique, prior to the injection-molding process for forming the resin mold 29.

In accordance with the first embodiment, each of the stages 7 and 9 has the square shape in plan view. It is possible for each of the stages 7 and 9 to have a modified shape that allows the magnetic sensor chips 3 and 5 to be mounted thereon. Typical examples of the shape in plan view of the stages 7 and 9 may include, but are not limited to, a square, a rectangle, a circle, and an oval. Other typical examples of the stages 7 and 9 may include, but are not limited to, a meshed stage and another stage that has one or more through holes which penetrate in the thickness-defining direction of the stage. The stages 7 and 9 may also be different in shape or size from each other.

In accordance with the first embodiment, the magnetic sensor chips 3 and 5, the stages 7 and 9 and the leads 17 are fixed to and encapsulated in the resin mold 29. It is possible as a modification to form a semiconductor package that contains and encapsulates the magnetic sensor chips 3 and 5, the stages 7 and 9 and the leads 17.

In accordance with the first embodiment, the lead frame 1 includes the square frame portion 15 that has a generally square shape. It is also possible to modify the shape in plan view of the frame portion. Typical examples of the shape in plan view of the frame portion may include, but are not limited to, a general square and a general rectangle.

In accordance with the first embodiment, the magnetic sensor for sensing the azimuth and the magnitude of geomagnetism is provided. It is possible as a modification of the above-described lead frame to mount another sensor for sensing at least the direction, the azimuth or the orientation of a physical quantity in the three-dimensional space. Typical examples of the physical quantity include magnetic field, acceleration and other vector quantities. It is possible for the lead frame 1 to mount an acceleration sensor chip that senses the direction and the magnitude of acceleration.

SECOND EMBODIMENT

Figure 9:
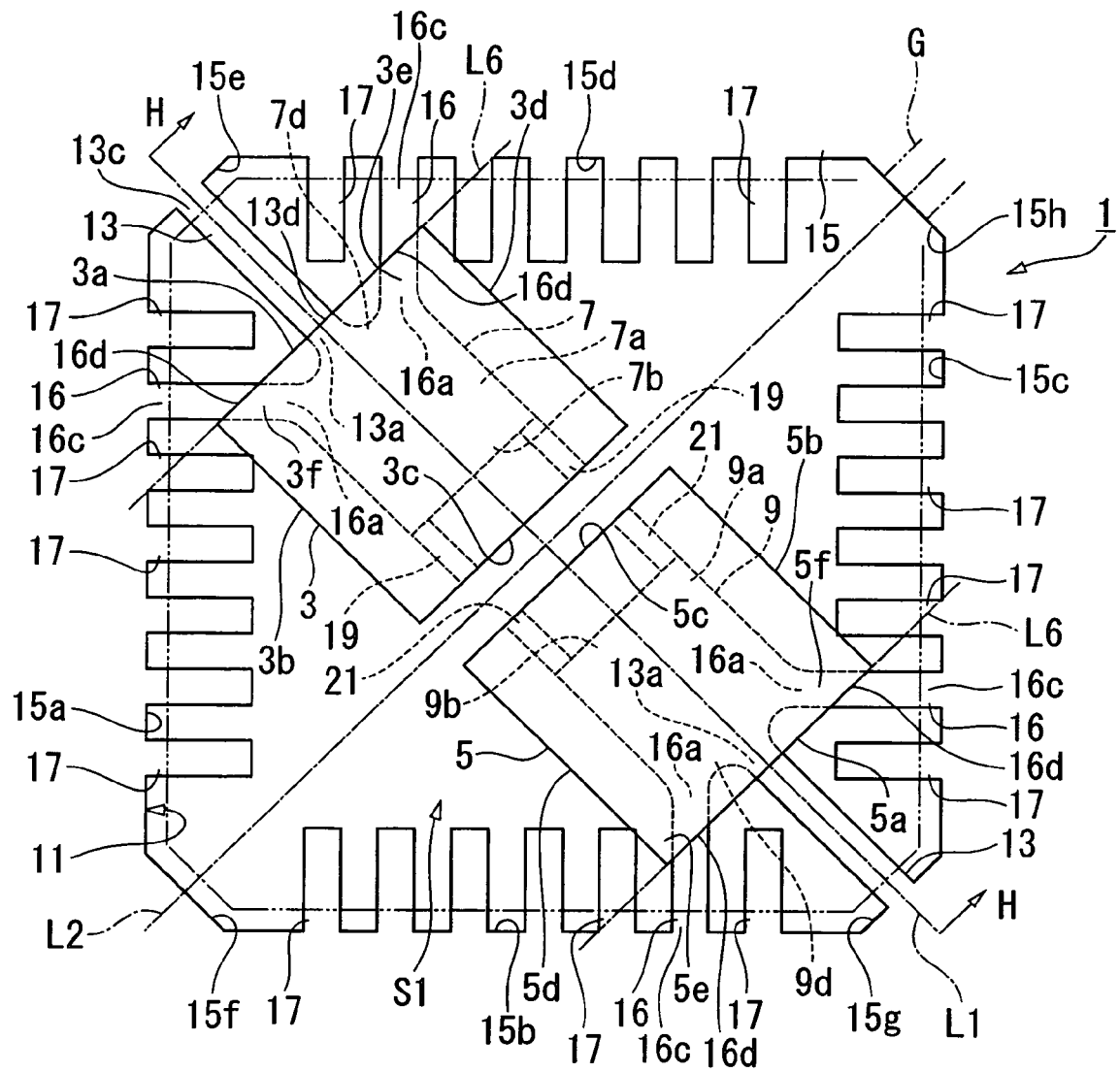
FIG. 9 is a plan view illustrating a lead frame with magnetic sensor chips in accordance with a second preferred embodiment of the present invention.
Figure 10:
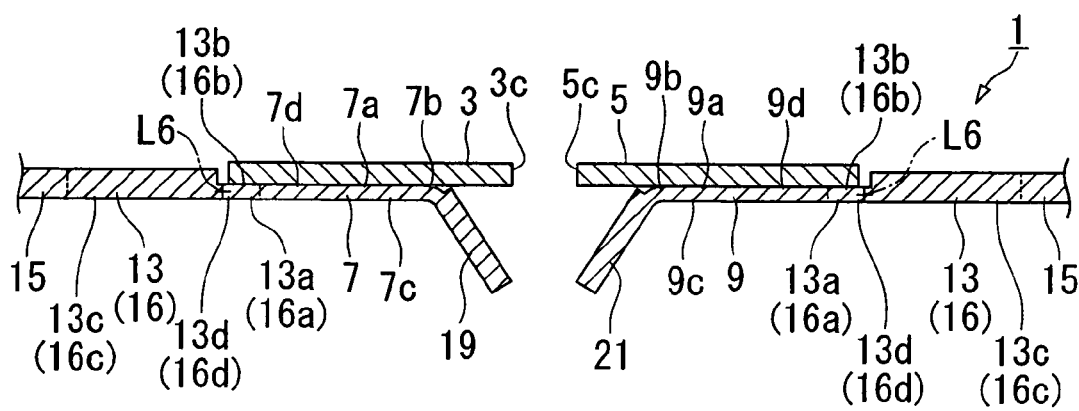
FIG. 10 is a cross sectional view of a lead frame, taken along an H-H line of FIG. 9.

A second embodiment of the present invention will be described. The following descriptions will be directed to differences of the second embodiment from the above-described first embodiment. FIG. 9 is a plan view illustrating a lead frame with magnetic sensor chips in accordance with a second preferred embodiment of the present invention. FIG. 10 is a cross sectional view of a lead frame, taken along an H-H line of FIG. 9. A sensor for sensing a physical quantity can be realized by a lead frame on which a plurality of sensor chips for sensing a physical quantity are mounted. A typical example of the sensor for sensing a physical quantity may include, but is not limited to, a magnetic sensor for sensing the direction and the magnitude of a magnetic field.

A magnetic sensor in accordance with this embodiment of the present invention comprises a lead frame 1 and two magnetic sensor chips 3, 5 that are mounted on the lead frame 1.

Each of the two magnetic sensor chips 3, 5 measures the direction and the magnitude of an external magnetic field applied to the magnetic sensor. The lead frame I can be formed by processes for pressing and etching a metal plate such as a copper thin plate.

As shown in FIGS. 9 and 10, the lead frame 1 includes two stages 7 and 9 on which magnetic sensor chips 3 and 5 are mounted, respectively. Each of the two stages 7 and 9 has a square shape in plan view. The lead frame 1 further includes a frame 11 that mechanically supports the two stages 7 and 9. The lead frame 1 furthermore includes connections 13, each of which mechanically inter-connects each of the stages 7 and 9 to the frame 11. The lead frame 1 still further includes modified leads that mechanically inter-connect the stages 7 and 9 to the frame 11. The stages 7 and 9, the connections 13 and the frame 11 are integrated to form a monolithic structure.

The frame 11 further includes a square frame portion 15 and a plurality of leads 17. The square frame portion 15 has a generally square shape. For example, the square frame portion 15 has four sides 15a, 15b, 15c, and 15d, that define an internal region S1. Thus, the internal region S1 has a generally square shape. The stages 7 and 9 are positioned in the internal region S1. The square frame portion 15 encompasses the stages 7 and 9. The leads 17 extend inwardly from the four sides 15a, 15b, 15c, and 15d, of the square frame portion 15.

The plurality of leads 17 comprise first to fourth sub-pluralities of leads 17 that extend inwardly from the first to fourth sides 15a, 15b, 15c, and 15d of the square frame portion 15, respectively. The leads 17 are electrically connected to bonding pads of the magnetic sensor chips 3 and S. The bonding pads are not illustrated in the drawings.

The two stages 7 and 9 have surfaces 7a and 9a on which the magnetic sensor chips 3 and 5 are mounted, respectively. Each of the surfaces 7a and 9a may have a generally square shape in plan view. The square frame portion 1S has first to fourth corners 15e, 15f, 15g and 15h. The first side 15a extends between the first and second corners 15e and 15f. The second side 15b extends between the second and third corners 15f and 15g. The third side 15c extends between the third and fourth corners 15g and 15h. The fourth side 15d extends between the fourth and first corners 15h and 15e.

The square frame portion 15 defines first and second diagonal lines L1 and L2 that cross each other at a right angle. The first diagonal line L1 extends between the first and third corners 15e and 15g. The second diagonal line L2 extends between the second and fourth corners 15f and 15h. The first and third corners 15e and 15g are positioned symmetrically to each other with reference to the reflection-symmetric axis of the second diagonal line L2. The second and fourth corners 15f and 15h are positioned symmetrically to each other with reference to the reflection-symmetric axis of the first diagonal line L1.

The stages 7 and 9 are smaller in plan size than the magnetic sensor chips 3 and 5. The stages 7 and 9 are positioned near the first and third corners 15e and 15g, respectively. The stages 7 and 9 are placed on the first diagonal line L1. The stages 7 and 9 are placed at positions that are symmetrical to each other with reference to the reflection-symmetric axis of the second diagonal line L2. The stages 7 and 9 are disposed symmetrically to each other with reference to the reflection-symmetric axis of the second diagonal line L2. The stages 7 and 9 are distanced from the second diagonal line L2. Each of the stages 7 and 9 extends two-dimensionally and symmetrically with reference to the reflection-symmetric axis of the first diagonal line L1.

As shown in FIG. 10, the stage 7 has the first surface 7a and a second surface 7c that is opposite to the first surface 7a. The stage 7 further has a center line that is aligned to the first diagonal line L1. As described above, the stage 7 has the generally square shape. The stage 7 has four sides, where two sides 7b and 7d are parallel to the second diagonal line L2 and perpendicular to the first diagonal line L1, while the remaining two sides are parallel to the first diagonal line L1 and perpendicular to the second diagonal line L2. The side 7b is proximal to the second diagonal line L2 but is distal from the first corner 15e of the square frame portion 15. The opposite side 7d is proximal to the first corner 15e and is distal from the diagonal line L2. The four sides of the stage 7 are not parallel to nor perpendicular to the four sides 15a, 15b, 15c, and 15d, of the square frame portion 15.

Two projecting parts 19 extend from the bottom surface 7c in a direction vertical to a plane that includes the first and second diagonal lines L1 and L2. Preferably, the projecting parts 19 extend from positions adjacent to the side 7b of the stage 7. The paired projecting parts 19 are distanced from each other and positioned symmetrically to each other with reference to the reflection-symmetric axis of the first diagonal line L1. The distance between the projecting parts 19 prevents the stage 7 from being twisted around the first diagonal line L1 in a process for causing the stage 7 to be sloped.

As shown in FIG. 10, the stage 9 has the first surface 9a and a second surface 9c that is opposite to the first surface 9a. The stage 9 further has a center line that is aligned to the first diagonal line L1. As described above, the stage 9 has the generally square shape. The stage 9 has four sides, where two sides 9b and 9d are parallel to the second diagonal line L2 and perpendicular to the first diagonal line L1, while the remaining two sides are parallel to the first diagonal line L1 and perpendicular to the second diagonal line L2. The side 9b is proximal to the second diagonal line L2 but is distal from the third corner 15g of the square frame portion 15. The opposite side 9d is proximal to the third corner 15g and is distal from the diagonal line L2. The four sides of the stage 9 are not parallel to nor perpendicular to the four sides 15a, 15b , 15c and 15d of the square frame portion 15.

Two projecting parts 21 extend from the bottom surface 9c in a direction vertical to a plane that includes the first and second diagonal lines L1 and L2. Preferably, the projecting parts 21 extend from positions adjacent to the side 9b of the stage 9. The paired projecting parts 21 are distanced from each other and positioned symmetrically to each other with reference to the reflection-symmetric axis of the first diagonal line L1. The distance between the projecting parts 21 prevents the stage 9 from being twisted around the first diagonal line L1 in a process for causing the stage 9 to be sloped.

First to fourth pluralities of leads 17 extend inwardly from the first to fourth sides 15a, 15b , 15c and 15d of the square frame portion 15, respectively. Each of the stages 7 and 9 is connected to the square frame portion 15 through the connections 13 and a pair of the modified leads 16. A first one of the connections 13 extends along the first diagonal line L1 from the first corner 15e of the square frame portion 15 to the center of the side 7d of the stage 7. A first one of the paired modified leads 16 extends from the fourth side 15d, of the square frame portion 15 to a first end of the side 7d of the stage 7. A second one of the paired modified leads 16 extends parallel to the fourth plurality of leads 17 that extend from the fourth side 15d. The modified lead 16 extends from the first side 15a of the square frame portion 15. to a second end of the side 7d of the stage 7. The modified lead 16 extends parallel to the first plurality of leads 17 that extend from the first side 15a. A second one of the connections 13 extends along the first diagonal line L1 from the third corner 15f of the square frame portion 15 to the center of the side 9d of the stage 9. A third modified lead 16 extends from the second side 15d of the square frame portion 15 to a first end of the side 9d of the stage 9. The third modified lead 16 extends parallel to the second plurality of leads 17 that extend from the second side 15d. A fourth modified lead 16 extends from the third side 15c, of the square frame portion 15 to a second end of the side 9d of the stage 9. The fourth modified lead 16 extends parallel to the third plurality of leads 17 that extend from the third side 15c.

As shown in FIG. 10, the connection 13 extending from the first corner 15e has a thin portion 13a that is adjacent to the side 7d of the stage 7 and distal from the first corner 15e. The connection 13 has a step 13d which provides a boundary between the thin portion 13a and the remaining portion. The first and second modified leads 16 also have thin portions 16a that are proximal to the side 7d of the stage 7 and distal from the first and fourth sides 15a and 15d, of the square frame portion 15. The first and second modified leads 16 also have steps 16d which provide mounds between the thin portions 16a and the remaining portions.

The connection 13 extending from the third corner 15g has a thin portion 13a that is adjacent to the side 9d of the stage 9 and distal from the third corner 15g. The connection 13 has a step 13d which provides a boundary between the thin portion 13a and the remaining portion. The first and second modified leads 16 also have thin portions 16a that are proximal to the side 9d of the stage 9 and distal from the first and fourth sides 15a and 15d, of the square frame portion 15. The first and second modified leads 16 also have steps 16d which provide mounds between the thin portions 16a and the remaining portions. Those thin portions 13a and 16a have the same thickness as the stages 7 and 9. Those thin portions 13a and 16a are smaller in thickness than the projecting parts 19 and 21.

The side 7b of the stage 7 has steps that bound with the projecting portions 19. The side 9b of the stage 9 has steps that bound with the projecting portions 21.

Those thin portions may be formed by a known photo-etching process, for example. The magnetic sensor chips 3 and 5 are mounted on the stages 7 and 9 and the thin portions 13a and 16a of the connections and the modified loads 16.

The magnetic sensor chip 3 has first to fourth sides 3a, 3b, 3c and 3d. The first side 3a is proximal to the first corner 15e of the square frame portion 15 and distal from the second diagonal line L2. The first side 3a of the magnetic sensor chip 3 is aligned to and overlaps the reference axial line L6 that is parallel to the second diagonal line L2 and is perpendicular to the first diagonal line L1. The first side 3a is adjacent to the step of the connection 13 and to the steps of the first and second modified leads 16. The steps of the connection 13 and of the modified leads 16 are, in plan view, aligned to the reference axial line L6, and are adjacent to the side 3a of the magnetic sensor chip 3. The magnetic sensor chip 3 has corners 3e and 3f, between which the side 3a extends. The corners 3e and 3f are adjacent to the steps of the modified leads 16. The corners 3e and 3f overlap the modified leads 16, but do not overlap the leads 17, so that all of the first and fourth pluralities of leads 17 are connected to bonding pads of the magnetic sensor chip 5.

The magnetic sensor chip 5 has first to fourth sides 5a, 5b, 5c and 5d. The first side 5a is proximal to the third corner 15g of the square frame portion 15 and distal from the second diagonal line L2. The first side 5a of the magnetic sensor chip 5 is aligned to and overlaps the reference axial line L6 that is parallel to the second diagonal line L2 and is perpendicular to the first diagonal line L1. The first side 5a is adjacent to the step of the connection 13 and to the steps of the first and second modified leads 16. The steps of the connection 13 and of the modified leads 16 are, in plan view, aligned to the reference axial line L6, and are adjacent to the side 5a of the magnetic sensor chip 5. The magnetic sensor chip 5 has corners 5e and 5f, between which the side 5a extends. The corners 5e and 5f are adjacent to the steps of the modified leads 16. The corners 5e and 5f overlap the modified leads 16, but do not overlap the leads 17, so that all of the first and fourth pluralities of leads 17 are connected to bonding pads of the magnetic sensor chip 5.

The above-described steps 13d and 16d of the connections 13 and the modified leads 16 define flexible portions of the thin portions 13a and 16a. The flexible portions are adjacent to the steps 13d and 16d. The flexible portions allow the connections 13 and the modified leads 16 to be bent easily.

As described above with reference to FIG. 10, the steps are formed at boundaries between the stages 7 and 9 and the projecting parts 19 and 21, respectively. The steps also define flexible portions of the stages 7 and 9. The flexible portions are adjacent to the steps. The flexible portions make it easy to set accurately an angle of the projecting parts 19 and 21 with the stages 7 and 9.

Figure 11:
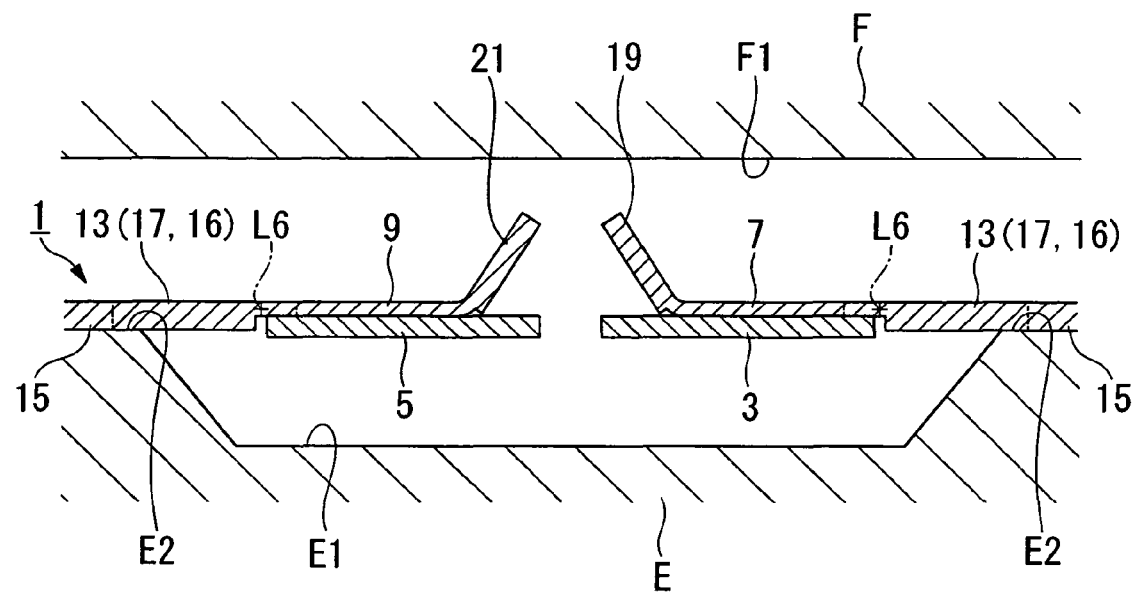
FIG. 11 is a fragmentary cross sectional elevation view illustrating the lead frame in a step involved in a method of forming the magnetic sensor by using the lead frame of FIG. 9 in accordance with the second embodiment of the present invention.
Figure 12:
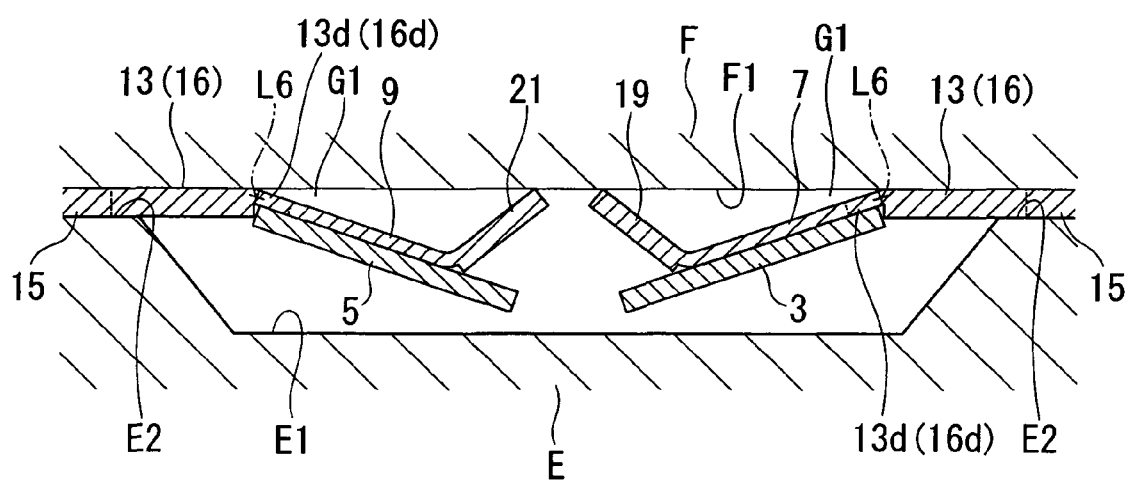
FIG. 12 is a fragmentary cross sectional elevation view illustrating the lead frame in another step involved in the method of forming the magnetic sensor by using the lead frame of FIG. 9 in accordance with the second embodiment of the present invention.

A method of forming a magnetic sensor using the above-described lead frame 1 of FIG. 9 will be described. FIG. 11 is a fragmentary cross sectional elevation view illustrating the lead frame in a step involved in a method of forming the magnetic sensor by using the lead frame of FIG. 9 in accordance with the second embodiment of the present invention. FIG. 12 is a fragmentary cross sectional elevation view illustrating the lead frame in another step involved in the method of forming the magnetic sensor by using the lead frame of FIG. 9 in accordance with the second embodiment of the present invention.

First, the lead frame 1 described above with reference to FIGS. 9 and 10 is prepared. The magnetic sensor chips 3 and 5 are bonded to the first surfaces 7a and 9a of the stages 7 and 9, respectively.

The magnetic sensor chip 3 extends over the stage 7 and the outside thereof and also over the above-described thin portions of the connection 13 and the modified leads 16. The magnetic sensor chip 3 has the first to fourth sides 3a, 3b, 3c and 3d that are not parallel to or perpendicular to the first to fourth sides 15a, 15b, 15c and 15d of the square frame portion 15. The first side 3a of the magnetic sensor chip 3 is aligned to and overlaps the reference axial line L6 that is parallel to the second diagonal line L2 and is perpendicular to the first diagonal line L1. The first side 3a is adjacent to the step of the connection 13 and to the steps of the first and second modified leads 16. The steps of the connection 13 and of the modified leads 16 are, in plan view, aligned to the reference axial line L6, and are adjacent to the side 3a of the magnetic sensor chip 3. The magnetic sensor chip 3 has corners 3e and 3f, between which the side 3a extends. The corners 3e and 3f are adjacent to the steps of the modified leads 16. The corners 3e and 3f overlap the modified leads 16, but do not overlap the leads 17, so that all of the first and fourth pluralities of leads 17 are connected to bonding pads of the magnetic sensor chip 3.

The magnetic sensor chip 5 extends over the stage 9 and the outside thereof and also over the above-described thin portions of the connection 13 and the modified leads 16. The magnetic sensor chip 5 has the first to fourth sides 5a, 5b, 5c and 5d that are not parallel to or perpendicular to the first to fourth sides 15a, 15b, 15c and 15d of the square frame portion 15. The first side 5a of the magnetic sensor chip 5 is aligned to and overlaps the reference axial line L6 that is parallel to the second diagonal line L2 and is perpendicular to the first diagonal line L1. The first side 5a is adjacent to the step of the connection 13 and to the steps of the first and second modified leads 16. The steps of the connection 13 and of the modified leads 16 are, in plan view, aligned to the reference axial line L6, and are adjacent to the side 5a of the magnetic sensor chip 5. The magnetic sensor chip 5 has corners 5e and 5f, between which the side 5a extends. The corners 5e and 5f are adjacent to the steps of the modified leads 16. The corners 5e and 5f overlap the modified leads 16, but do not overlap the leads 17, so that all of the first and fourth pluralities of leads 17 are connected to bonding pads of the magnetic sensor chip 5.

Subsequently, the leads 17 of the lead frame 1 are electrically connected through wirings to bonding pads that are provided on each of the magnetic sensor chips 3 and 5. The bonding pads are not illustrated in the drawings. The wirings can advantageously be flexible so as to allow the stages 7 and 9 to be sloped down or declined in a later process for bending the connections 13 and the modified leads 16, thereby changing relative positions of the bonding pads of the magnetic sensor chips 3 and S with reference to the lead frames 17.

Subsequently, a resin mold is formed, which encapsulates and seals the magnetic sensor chips 3 and 5, a semiconductor chip 27, the stages 7 and 9, and the leads 17.

With reference to FIG. 11, first and second dies "E" and "F" are prepared. The first die "E" has a concave "E1" and a peripheral ridge "E2". The second die "F" has a flat surface "F1". The concave "E1" and the flat surface "F1" define a cavity of the dies "E" and "F". The lead frame 1 is placed on the first die "E", wherein the square frame portion 15 is in contact with the peripheral ridge "E2". The leads 17, the magnetic sensor chips 3 and 5, the stages 7 and 9, the connections 13 and the projecting parts 19 and 21 are positioned over the concave "E1" of the first die "E". When the lead frame 1 is placed on the first die "E", the magnetic sensor chips 3 and 5 are positioned under the stages 7 and 9, and the projecting parts 19 and 21 extend upwardly from the second surfaces 7c and 9c of the stages 7 and 9, respectively. The magnetic sensor chips 3 and 5 are distanced by a gap from the concave "E1" of the first die "E". The projecting parts 19 and 21 are also distanced by another gap from the flat surface "F1".

With reference to FIG. 12, the second die "F" moves toward the first die "E", so that the flat surface "F1" presses down the projecting parts 19 and 21 until the first and second dies "E" and "F" sandwich the square frame portion 15 of the lead frame 1, whereby the connections 13 and the modified leads 16 are bent on the reference axial lines L6, and the stages 7 and 9 are sloped down or declined from the plane that includes the first and second diagonal lines L1 and L2. Since the square frame portion 15 extends two-dimensionally in the plane that includes the first and second diagonal lines L1 and L2, the plane also includes the square frame portion 15. The magnetic sensor chips 3 and 5 which are respectively mounted on the stages 7 and 9 are also sloped down or declined together with the stages 7 and 9. The sloped magnetic sensor chips 3 and 5 have a predetermined slope angle with reference to the square frame portion 15 and to the flat surface "F1". The predetermined slope angle is determined by the projecting parts 19 and 21. For example, the predetermined slope angle is determined by a distance between the reference axial line L6 and each of the projecting parts 19 and 21 and by a dimension or size of each of the projecting parts 19 and 21, wherein the dimension is defined in a direction vertical to the plane that includes each of the projecting parts 19 and 21. When the first and second dies "E" and "F" sandwich the square frame portion 15, the first surface of the square frame portion 15 is in contact with the peripheral ridge "E2" of the first die "E", while the second surface of the square frame portion 15 is in contact with the flat surface "F1".

A molten resin is injected into the cavity of the dies "E" and "F" with the second die "F" continuing to hold down the projecting parts 19 and 21, whereby the magnetic sensor chips 3 and 5 and the stages 7 and 9 are molded and sealed with the resin. As described above, the cavity is defined by the concave "E1" of the first die "E" and the flat surface "F1" of the second die "F".

In the injection-molding process, the molten resin is injected into the cavity through a gate "G" shown in FIG. 9. The gate "G" is positioned on the second diagonal line L2 and at the fourth corner 15h of the square frame portion 15 of the lead frame 1. In the cavity, the molten resin when injected will flow with a spread toward the first, second and third corners 15e, 15f and 15g and the first and second sides 15a and 15b. This flow of the molten resin will include a primary stream toward the second corner 15f opposing to the gate "G" and secondary streams toward the first and second sides 15a and 15b and the first and third corners 15e and 15g. The secondary streams are caused by the spread from the primary stream. The primary stream of the molten resin will run along the second diagonal line L2. As described above, the reference axial lines L6 at which the connections 13 and the modified leads 16 are bent are parallel to the second diagonal line L2. The reference axial line L6 is parallel to the second diagonal line L6. The primary stream that runs along the second diagonal line L2 will be directed in parallel to the reference axial lines L6. The first and second surfaces 7a and 7c of the sloped or declined stage 7 are parallel to the second diagonal line L2. The first and second surfaces 9a and 9c of the sloped or declined stage 9 are parallel to the second diagonal line L2. The sloped or declined magnetic sensor chips 3 and 5 which are respectively mounted on the sloped or declined stages 7 and 9 are also parallel to the second diagonal line L2. Accordingly, the primary stream of the molten resin will be directed in parallel to the sloped or declined stages 7 and 9 and to the sloped or declined magnetic sensor chips 3 and 5. This means that the primary stream of the molten resin can not be disturbed substantially by the presence of the sloped stages 7 and 9 and the sloped magnetic sensor chips 3 and 5. Further, the primary stream of the molten resin can not push substantially the sloped stages 7 and 9 and the sloped magnetic sensor chips 3 and 5.

As shown in FIG. 12, when the first and second dies "E" and "F" sandwich the square frame portion 15, the flat surface "F1" of the second die "F" is in contact with the second surface 15j of the square frame portion 15. The first corners 7a and 9a of the stages 7 and 9 are distanced by small gaps G1 from the flat surface "F1" of the second die "F". Since the primary stream of the molten resin can not be disturbed substantially by the stages 7 and 9 as described above, the molten resin can fill up the small gaps G1 without receiving any substantive disturbance by the stages 7 and 9. Preferably, the resin has a high fluidity in order to prevent the flow of the molten resin when injected in the cavity from changing the slope angle of the sloped stages 7 and 9 and the sloped magnetic sensor chips 3 and 5.

Figure 13:
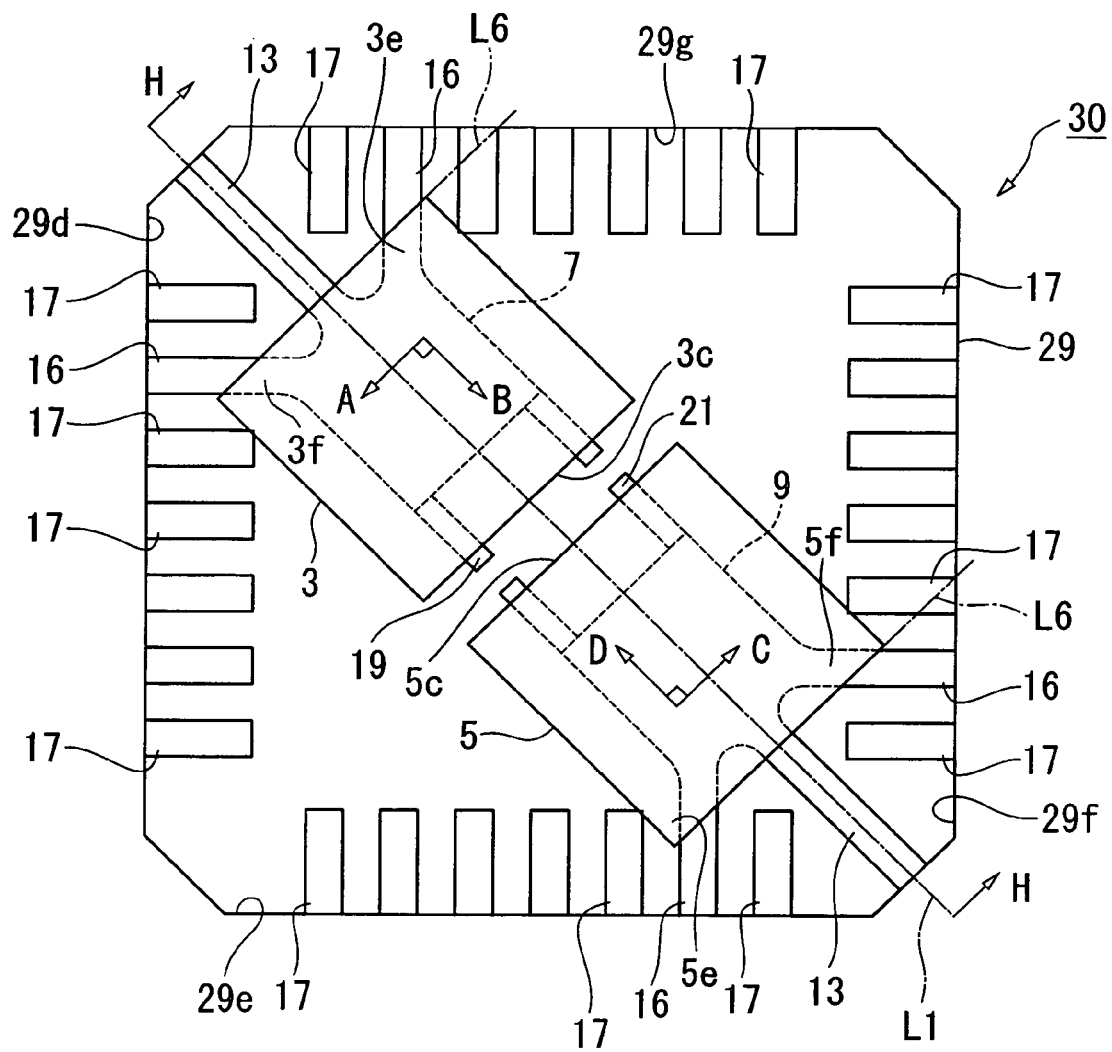
FIG. 13 is a plan view illustrating a magnetic sensor formed by using the lead frame 1 of FIG. 9.
Figure 14:
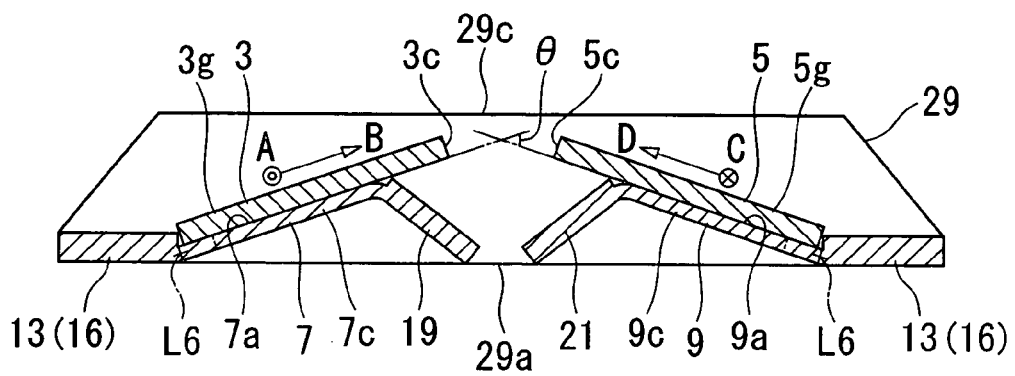
FIG. 14 is a cross sectional elevation view taken along an H-H line of FIG. 13 illustrating the magnetic sensor.

FIG. 13 is a plan view illustrating a magnetic sensor formed by using the lead frame 1 of FIG. 9. FIG. 14 is a cross sectional elevation view taken along an H-H line of FIG. 13 illustrating the magnetic sensor. In the above-described process for molding the lead frame 1, the sloped magnetic sensor chips 3 and 5 on the sloped stages 7 and 9 are sealed with the molten resin when injected into the cavity. The molten resin is then cooled and solidified to form a resin mold 29. As shown in FIGS. 13 and 14, through the molding process, the sloped magnetic sensor chips 3 and 5 on the sloped stages 7 and 9 are encapsulated and sealed with the resin mold 29. The sloped magnetic sensor chips 3 and 5 are fixed in the resin mold 29, while the square frame portion 15 extends outside the resin mold 29.

The square frame portion 15 outside the resin mold 29 is then cut off and removed from the resin mold 29. The outside portions of the connections 13 and the leads 17 are detruncated and removed from the resin mold 29, thereby completing a magnetic sensor 30.

The magnetic sensor 30 includes the sloped magnetic sensor chips 3 and 5, the sloped stages 7 and 9, the projecting parts 19 and 21, remaining portions of the leads 17, remaining portions of the connections 13, and the resin mold 29 that seals and encapsulates those elements. The resin mold 29 has a generally square shape in plan view. The resin mold 29 further has a flat bottom surface 29a and a flat top surface 29c. The connections 13 have surfaces 13b that are leveled to and shown in the flat bottom surface 29a. The projecting parts 19 and 21 have tops that are leveled to and shown in the flat bottom surface 29a. The leads 17 are connected to the sloped magnetic sensor chips 3 and 5 through wirings that are not illustrated. The wirings are also sealed and encapsulated by the resin mold 29.

The sloped magnetic sensor chips 3 and 5 are buried in the resin mold 29, wherein the sloped magnetic sensor chips 3 and 5 tilt from the flat bottom surface 29a of the resin mold 29. The sloped magnetic sensor chips 3 and 5 are included in two sloped planes that cross each other at an acute angle θ. Namely, the sloped magnetic sensor chips 3 and 5 have sloped angles that are different from each other by the acute angle θ. This angle θ is shown in FIG. 14 and is different from the above-described slope angle. Since the magnetic sensor chips 3 and 5 are mounted on the sloped stages 7 and 9, the sloped angles 7 and 9 are also included in two sloped planes that cross each other at the acute angle θ. Namely, the sloped stages 7 and 9 have sloped angles that are different from each other by the acute angle θ.

The corners 3e and 3f of the magnetic sensor chip 3 are adjacent to and positioned over the modified leads 16.

Each of the sloped magnetic sensor chips 3 and 5 is configured to sense two components of an external magnetic field applied to the magnetic sensor 30. The directions of the two components are perpendicular to each other but both are parallel to the sloped plane including the sloped magnetic sensor chip 3 or 5. For example, in FIG. 14, the sloped magnetic sensor chip 3 senses a first component of the external magnetic field in a first direction marked by an arrow "A" and a second component of the external magnetic field in a second direction marked by an arrow "B". The first and second directions "A" and "B" are perpendicular to each other but both are parallel to the first sloped plane including the sloped magnetic sensor chip 3. The sloped magnetic sensor chip 5 senses a third component of the external magnetic field in a third direction marked by an arrow "C" and a fourth component of the external magnetic field in a fourth direction marked by an arrow "D". The third and fourth directions "C" and "D" are perpendicular to each other but both are parallel to the second sloped plane including the sloped magnetic sensor chip 5. The first and third directions "A" and "C" are anti-parallel to each other and both are perpendicular to the first diagonal line L1 and parallel to the second diagonal line L2. The second and fourth directions "B" and "D" are different from each other by the acute angle θ and both are perpendicular to the second diagonal line L2.

The first sloped plane including the first and second directions "A" and "B" and the second sloped plane including the first and second directions "C" and "D" cross each other at the above-described acute angle θ. This acute angle θ may theoretically be greater than 0 degree and at most 90 degrees, to enable the magnetic sensor 30 to sense accurately the azimuth of three-dimensional geomagnetism. The acute angle θ is preferably in the range of 20 degrees to 90 degrees, and more preferably in the range of 30 degrees to 90 degrees.

The magnetic sensor 30 may advantageously be integrated or mounted on a circuit board that is included in a device such as a mobile terminal. A typical example of the mobile terminal may include, but is not limited to, a cellular phone. When the magnetic sensor 30 is integrated in the cellular phone, it is advantageously possible for magnetic sensor 30 to sense the azimuth of geomagnetism and display it on a display panel of the cellular phone.

In accordance with the above-described magnetic sensor 30, the corners 3e and 3f of the magnetic sensor chip 3 are disposed over parts of the modified leads 16. Namely, the thin portions of the modified leads 16 serve as additional stages to the main stage 7 that support the magnetic sensor chip 3, so that the magnetic sensor chip 3 is disposed as close to the first and fourth sides 15a and 15d as possible without the magnetic sensor chip 3 overlapping the leads 17. The corners 3e and 3f are positioned in a looped area adjacent to the first to fourth sides 15a, 15b, 15c and 15d. The corners 3e and 3f do not overlap the leads 17 and the first to fourth sides 15a, 15b, 15c and 15d. Also, the corners 5e and 5f of the magnetic sensor chip 5 are disposed over parts of the modified leads 16. Namely, the thin portions of the modified leads 16 serve as additional stages to the main stage 9 that supports the magnetic sensor chip 5, so that the magnetic sensor chip 5 is disposed as close to the second and third sides 15b and 15c as possible without the magnetic sensor chip 5 overlapping the leads 17. The corners 5e and 5f are positioned in the looped area adjacent to the first to fourth sides 15a, 15b, 15c and 15d. The corners 5e and 5f do not overlap the leads 17 and the first to fourth sides 15a, 15b, 15c and 15d. This structure contributes to reducing the dimension of the magnetic sensor 30 in plan view.

As described above, the corners 3e and 3f of the magnetic sensor chip 3 overlap just two modified leads 16, and the corners 5e and 5f of the magnetic sensor chip 5 overlap just two modified leads 16. Namely, only four of the leads 17 are modified to be the modified leads 16 that support the magnetic sensor chips 3 and 5 in cooperation with the stages 7 and 9. One of the leads 17 extending from each of the first to fourth sides 15a, 15b, 15c and 15d, is modified to be the modified lead 16. The remaining leads 17 are electrically connected to the magnetic sensor chips 3 and 5. This structure is effective and advantageous to ensure that a sufficient number of the leads 17 are electrically connected to the magnetic sensor chips 3 and 5, without changing or modifying the layout of the leads 17 relative to the square frame portion 15 and the resin mold 29. The sufficient number of the leads 17 allows a sufficient number of signals to be inputted into or outputted from the magnetic sensor chips 3 and 5. This allows the magnetic sensor 30 to exhibit a desired high performance.

The above-described structure does not need any change to the layout of the leads 17 relative to the square frame portion 15 and the resin mold 29. This makes it possible to manufacture the magnetic sensor 30 with high performance at a low cost.

In accordance with the above-described embodiment, the sloped stages 7 and 9 and the sloped magnetic sensor chips 3 and 5 are distanced from the second diagonal line L2 along which the primary stream of the molten resin when injected runs in the above-described injection molding process. Thus, the sloped stages 7 and 9 and the sloped magnetic sensor chips 3 and 5 are not exposed to the primary stream of the molten resin when injected in the injection molding process. Namely, the primary stream of the molten resin when injected in the cavity can not push substantially the sloped stages 7 and 9 and the sloped magnetic sensor chips 3 and 5, thereby causing substantially no changes to the slope angles of the magnetic sensor chips 3 and 5. Substantially no changes to the slope angles of the magnetic sensor chips 3 and 5 cause substantially no change to the above-described acute angle defined between the sloped magnetic sensor chips 3 and 5.

Since the primary stream of the molten resin can not be disturbed substantially by the stages 7 and 9 as described above, the molten resin can fill up the above-described small gaps G1 shown in FIG. 12. Further, the molten resin can fill up the corner 15f opposite to the corner 15h at which the gate G is provided. Namely, the molten resin can fill up the cavity of the dies "E" and "F". This contributes to preventing the formation of any voids in the resin mold 29.

As described above, the stages 7 and 9 of the lead frame 1 are connected through the connections 13 to the first and third corners 15e and 15g of the square frame portion 15. The first and third corners 15e and 15g are distanced from the second diagonal line L2 along which the primary stream of the molten resin runs. This means that the first and third corners 15e and 15g are not exposed to the primary stream of the molten resin, but may be exposed to the secondary streams of the molten resin. The stages 7 and 9 are also distanced from the second diagonal line L2 along which the primary stream of the molten resin runs. This means that the stages 7 and 9 are not exposed to the primary stream of the molten resin, but may be exposed to the secondary streams of the molten resin. The secondary streams of the molten resin might further include no or a weak sub-stream that will push weakly the sloped stages 7 and 9 and the sloped magnetic sensor chips 3 and 5. Further, the secondary streams of the molten resin are lower in power than the primary stream. Therefore, the secondary streams can provide substantially no or weak pushing forces to the sloped stages 7 and 9 and the sloped magnetic sensor chips 3 and 5. This means that the flow of the molten resin can cause substantially no or small change to the slope angle of the magnetic sensor chips 3 and 5.

In accordance with the above-described embodiment, each of the stages 7 and 9 is connected to the square frame portion 15 through both the connection 13 and the modified leads 16. It is possible as a modification for each of the stages 7 and 9 to be connected to the square frame portion 15 through the modified leads 16 only without using the connection 13.

It is also possible as another modification for each of the stages 7 and 9 to be connected to the square frame portion 15 through the connection 13 only without using the modified leads 16. In the case of this modification, the corners 3e and 3f of the magnetic sensor chip 3 overlap just two of the leads 17, and the corners 5e and 5f of the magnetic sensor chip 5 overlap just the other two of the leads 17. Namely, only four of the leads 17 may support the magnetic sensor chips 3 and 5 in cooperation with the stages 7 and 9, without providing electrical connections to the magnetic sensor chips 3 and 5. The remaining leads 17 are electrically connected to the magnetic sensor chips 3 and 5. This structure is effective and advantageous to ensure that a sufficient number of the leads 17 are electrically connected to the magnetic sensor chips 3 and 5, without changing or modifying the layout of the leads 17 relative to the square frame portion 15 and the resin mold 29. The sufficient number of the leads 17 allows a sufficient number of signals to be inputted into or outputted from the magnetic sensor chips 3 and 5. This allows the magnetic sensor 30 to exhibit a desired high performance.

Figure 15A:
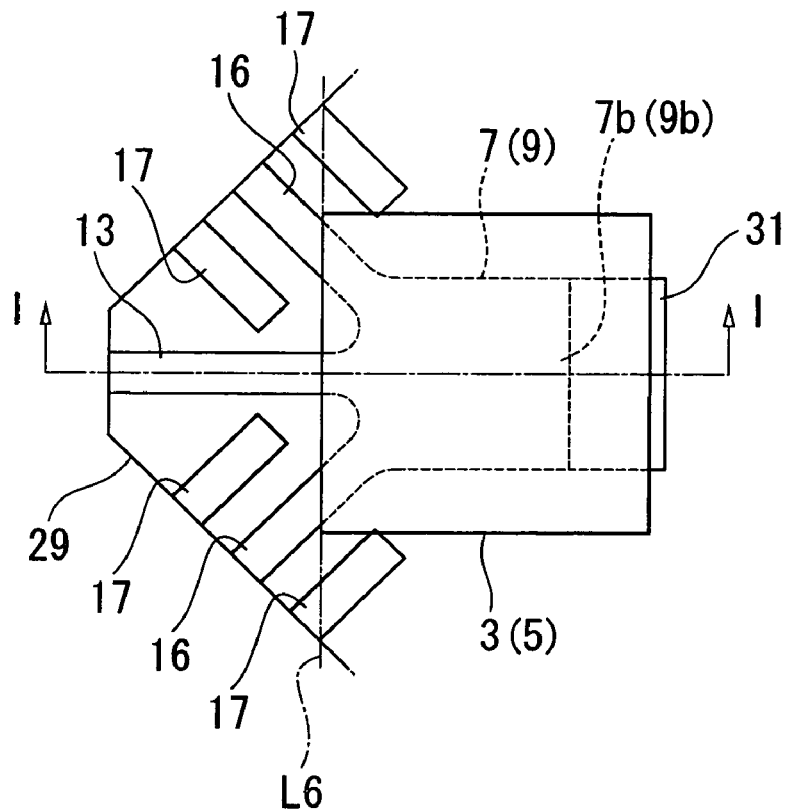
FIG. 15A is a fragmentary plan view illustrating a modified projecting part that is provided for the stage included in the lead frame in accordance with a modified example of the second embodiment of the present invention.
Figure 15B:
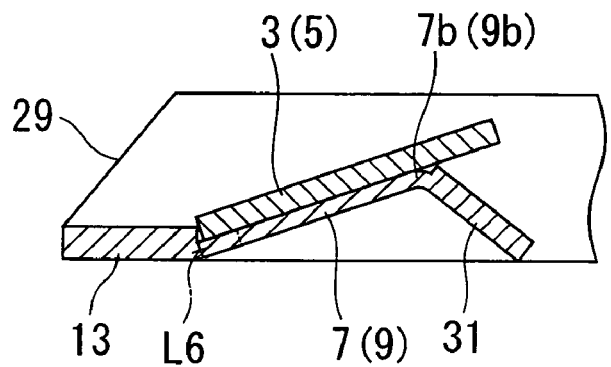
FIG. 15B is a fragmentary cross sectional elevation view illustrating the modified projecting part, taken along an I-I line of FIG. 15A.

In accordance with the second embodiment, a pair of the projecting parts 19 is provided for the stage 7, and another pair of the projecting parts 21 is provided for the stage 9. It is also possible as a modification for a single projecting part to be provided for each of the stages 7 and 9. FIG. 15A is a fragmentary plan view illustrating a modified projecting part that is provided for the stage included in the lead frame in accordance with a modified example of the second embodiment of the present invention. FIG. 15B is a fragmentary cross sectional elevation view illustrating the modified projecting part, taken along an I-I line of FIG. 15A. A single projecting part 31 is provided for each of the stages 7 and 9. The single projecting part 31 has the same width as each of the stages 7 and 9. The single projecting part 31 is thicker than each of the stages 7 and 9. The single projecting part 31 has a higher rigidity than the paired projecting parts 19 or 21. This high rigidity is effective and advantageous to bend the connection 13 and the modified leads 16 at the reference axial line L6 in the process of pressing the projecting part 31 with the die "F". This high rigidity further provides a desired high stability of the slope of each of the stages 7 and 9.

Figure 16A:
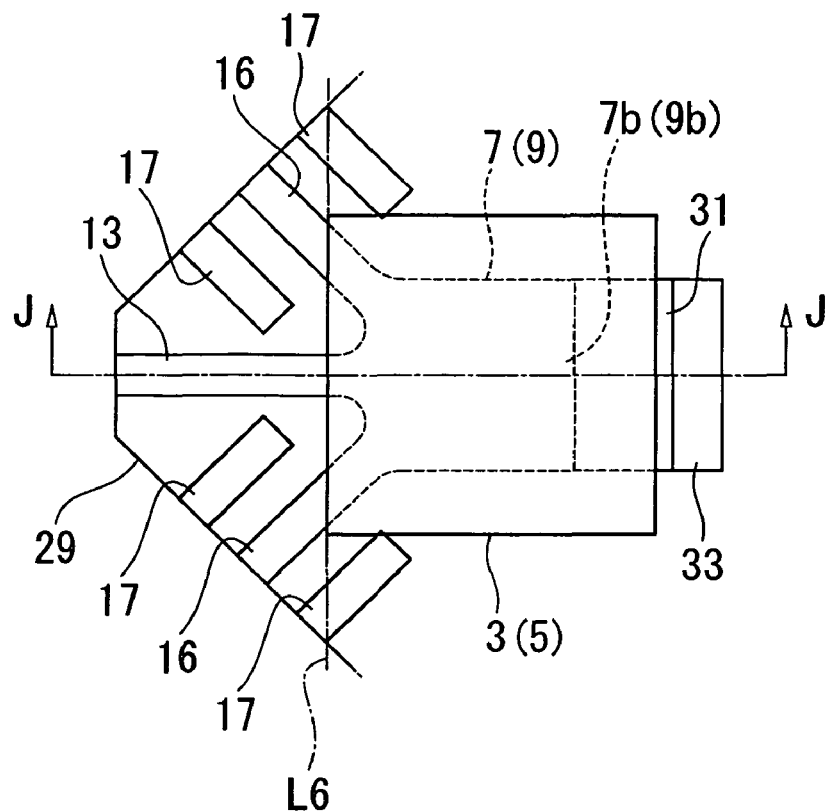
FIG. 16A is a fragmentary plan view illustrating a further modified projecting part that is provided for the stage included in the lead frame in accordance with a further modified example of the second embodiment of the present invention.
Figure 16B:
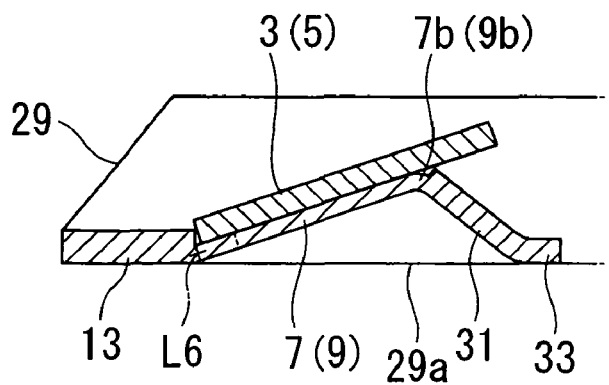
FIG. 16B is a fragmentary cross sectional elevation view illustrating the further modified projecting part, taken along a J-J line of FIG. 16A.
Figure 17:
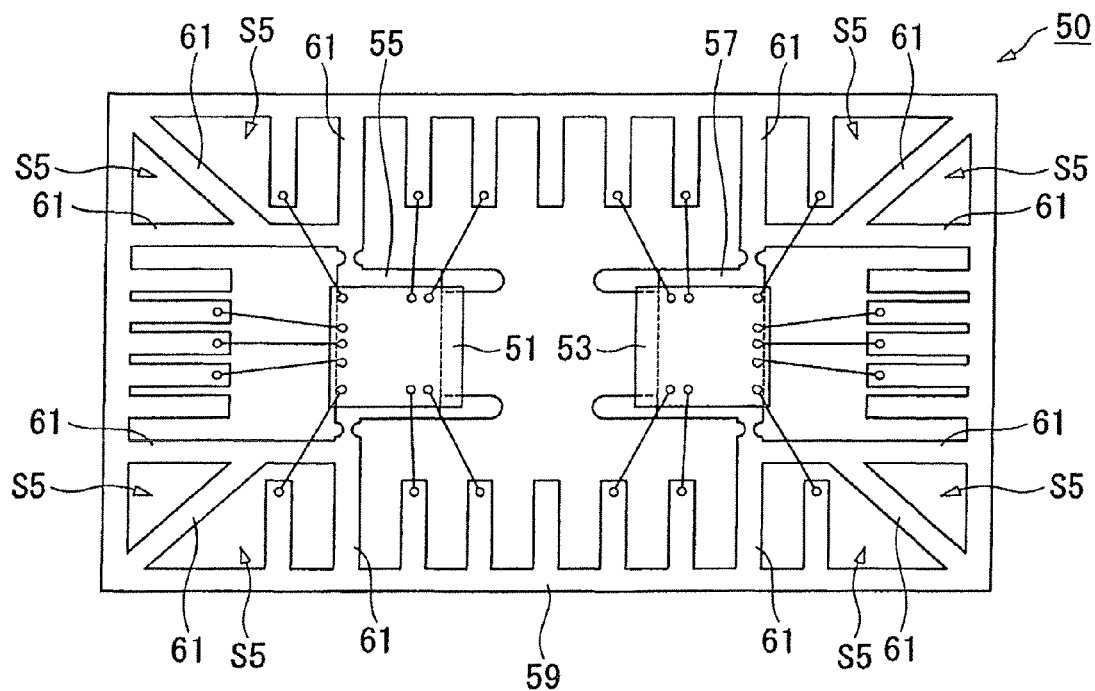
FIG. 17 is a plan view illustrating a conventional example of a lead frame to be used for forming a sensor that senses a physical quantity.
Figure 18:
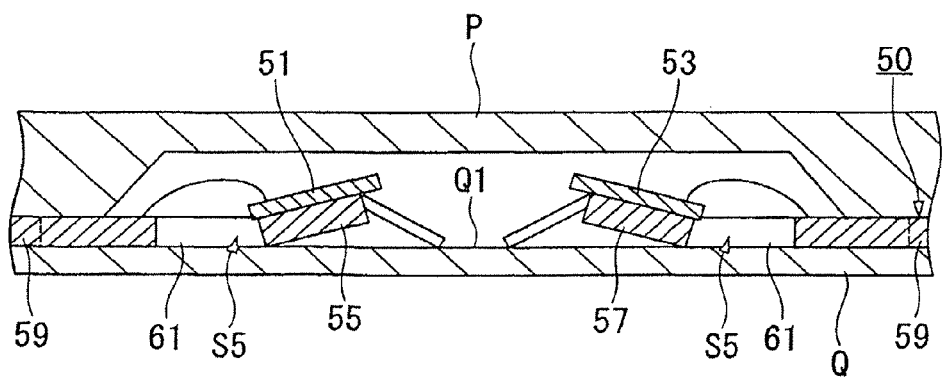
FIG. 18 is a fragmentary cross sectional elevation view illustrating a sensor including the lead frame of FIG. 17.

FIG. 16A is a fragmentary plan view illustrating a further modified projecting part that is provided for the stage included in the lead frame in accordance with a further modified example of the second embodiment of the present invention. FIG. 16B is a fragmentary cross sectional elevation view illustrating the further modified projecting part, taken along a J-J line of FIG. 16A. A single projecting part 31 with an extension 33 is provided for each of the stages 7 and 9. The extension 33 extends from the edge of the single projecting part 31. The extension 33 has a generally flat surface that receives a mechanical pressing force of the die "F" in the process of pressing the projecting part 31 with the die "F" for bending the connection 13 and the modified leads 16 at the reference axial line L6. The single projecting part 31 with the extension 33 has the same width as each of the stages 7 and 9. The single projecting part 31 with the extension 33 is thicker than each of the stages 7 and 9. The single projecting part 31 with the extension 33 has a higher rigidity than the paired projecting parts 19 or 21. This high rigidity is effective and advantageous to bend the connection 13 and the modified leads 16 at the reference axial line L6 in the process of pressing the projecting part 31 with the die "F". This high rigidity further provides a desired high stability of the slope of each of the stages 7 and 9.

In accordance with the second embodiment, the projecting parts 19 and 21 extend from the corners of the stages 7 and 9. It is possible that the projecting parts 19 and 21 extend from the bottom surfaces of the stages 7 and 9, regardless of the exact positions from which the projecting parts 19 and 21 extend.

In accordance with the second embodiment, the projecting parts 19 and 21 are used to slope or decline the stages 7 and 9. It is possible as a modification that none of the projecting parts 19 and 21 are needed, provided that the stages 7 and 9 with the magnetic sensor chips 3 and 5 have already been sloped or declined by the known or available technique, prior to the injection-molding process for forming the resin mold 29.

In accordance with the second embodiment, each of the stages 7 and 9 has the square shape in plan view. It is possible for each of the stages 7 and 9 to have a modified shape that allows the magnetic sensor chips 3 and 5 to be mounted thereon. Typical examples of the shape in plan view of the stages 7 and 9 may include, but are not limited to, a square, a rectangle, a circle, and an oval. Other typical examples of the stages 7 and 9 may include, but are not limited to, a meshed stage and another stage that has one or more through holes which penetrate in the thickness-defining direction of the stage. The stages 7 and 9 may also be different in shape or size from each other.

In accordance with the second embodiment, the magnetic sensor chips 3 and 5, the stages 7 and 9 and the leads 17 are fixed to and encapsulated in the resin mold 29. It is possible as a modification to form a semiconductor package that contains and encapsulates the magnetic sensor chips 3 and 5, the stages 7 and 9 and the leads 17.

In accordance with the above-described embodiment, the lead frame 1 includes the square frame portion 15 that has a generally square shape. It is also possible to modify the shape in plan view of the frame portion. Typical examples of the shape in plan view of the frame portion may include, but are not limited to, a general square and a general rectangle.

In accordance with the above-described embodiment, the magnetic sensor for sensing the azimuth and the magnitude of geomagnetism is provided. It is possible as a modification of the above-described lead frame to mount another sensor for sensing at least the direction, the azimuth or the orientation of a physical quantity in the three dimensional space. Typical examples of the physical quantity include magnetic field, acceleration and other vector quantities. It is possible for the lead frame 1 to mount an acceleration sensor chip that senses the direction and the magnitude of acceleration.

As used herein, the directional terms "up, down, inward, outward, forward, rearward, above, downward, perpendicular, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "rectangle" as used herein means a shape that has four straight sides and four right angles. The term "square" as used means a shape that has four sides of the same length and four right angles. The term "oblong" means a shape that has two long sides and two short sides and four right angles. Thus, the term "rectangle" includes the term "square" and the term "oblong".

The term "physical quantity" as used herein typically means a vector quantity. The term "physical quantity" may include a scalar quantity, the vector quantity and a tensor quantity.

The terms of degree such as "generally", "substantially," "about," and "approximately" as used herein mean a reasonable amount of deviation of the modified term such that the end result is not significantly changed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A lead frame, comprising:
a frame body that defines an internal region that is rectangular in shape and has four corners, the frame body extending in a first plane and having a first line that runs diagonally across the internal region between first opposite corners of the internal region, the internal region comprising first and second sub-regions that are separated from each other by the first line;
a plurality of leads that extend from the frame body;
a first stage being disposed in the first sub-region and extending in a second plane that is parallel to the first line and tilts from the first plane, and the first stage being connected to the frame body so as to be distanced from the first line; and
a second stage being disposed in the second sub-region and extending in a third plane that is parallel to the first line and tilts from the first plane and the second plane and the second stage being connected to the frame body so as to be distanced from the first line,
wherein the first and second stages are disposed symmetrically to each other with reference to a reflection-symmetric axis that is aligned to the first line.

2. The lead frame according to claim 1, wherein the first and second stages are distanced from the plurality of leads.

3. The lead frame according to claim 1, wherein the first and second stages are disposed on a second line that runs between second opposite corners of the internal region.

4. The lead frame according to 1, further comprising:
a first connector that mechanically connects the first stage to the frame body, the first connector being bent on a third line that is parallel to the first line, the first connector being distanced from the first line, and
a second connector that mechanically connects the second stage to the frame body, the second connector being bent on a fourth line that is parallel to the first line, the second connector being distanced from the first line.

5. The lead frame according to claim 4, wherein:
the first connector comprises a first connection portion that extends along a second line between the first stage and the frame body, the second line running between second opposite corners of the internal region; and
the second connector comprises a second connection portion that extends along the second line between the second stage and the frame body.

6. The lead frame according to claim 5, wherein:
the first connector further comprises a pair of third connections that extend from a first pair of two adjacent sides of the frame body, the first pair of two adjacent sides is closer to the first connector; and
the second connector further comprises a pair of fourth connections that extend from a second pair of two adjacent sides of the frame body, the second pair of two adjacent sides is closer to the second connector.

7. The lead frame according to claim 4, wherein:
the first connector further comprises a pair of third connections that extend from a first pair of two adjacent sides of the frame body, the first pair of two adjacent sides is closer to the first connector; and
the second connector further comprises a pair of fourth connections that extend from a second pair of two adjacent sides of the frame body, the second pair of two adjacent sides is closer to the second connector.

8. The lead frame according to claim 4, wherein:
the first stage has a first center line that is perpendicular to the first line; and
the second stage has a second center line that is aligned to the first center line.

9. The lead frame according to claim 1, further comprising:
a first projecting structure that extends from the first stage in a first direction, the first direction tilting from the second plane; and a second projecting structure that extends from the second stage in a second direction, the second direction tilting from the third plane.

10. A sensor comprising:

a frame body that defines an the internal region has having a rectangle shape and four corners, the frame body extending in a first plane and having a first line that runs diagonally across the internal region between first opposite corners of the internal region, the internal region comprising first and second sub-regions that are separated from each other by the first line;

a plurality of leads that extend from the frame body;

a first stage being disposed in the first sub-region and extending in a second plane that is parallel to the first line and tilts from the first plane, and the first stage being connected to the frame body so as to be distanced from the first line and the plurality of leads;

a second stage being disposed in the second sub-region and extending in a third plane that is parallel to the first line and tilts from the first plane and the second plane, and the second stage being connected to the frame body so as to be distanced from the first line and the plurality of leads;

a first sensor chip that is supported on the first stage;

a second sensor chip that is supported on the second stage;

a first connector that mechanically connects the first stage to the frame body, the first connector being bent on a second line that is parallel to the first line and being distanced from the first line; and a second connector that mechanically connects the second stage to the frame body, the second connector being bent on a third line that is parallel to the first line and being distanced from the first line, wherein the first and second stages are disposed on a fourth line that runs between second opposite corners of the internal region, and wherein the first and second stages are disposed symmetrically to each other with reference to a reflection-symmetric axis that is aligned to the first line.

11. A lead frame structure to be used for forming a sensor, the lead frame structure comprising:

a frame body that defines an internal region having a rectangle shape and has four corners, the frame body extending in a first plane and a first line that runs diagonally across the internal region between first opposite corners of the internal region, the internal region comprising first and second sub-regions that are separated from each other by the first line;

a plurality of leads that extend from the frame body;

a first stage being disposed in the first sub-region and extending in the first plane that is parallel to the first line, and the first stage being connected to the frame body so as to be distanced from the first line and the plurality of leads;

a second stage being disposed in the second sub-region and extending in the first plane that is parallel to the first line, the second stage being connected to the frame body so as to be distanced from the first line and the plurality of leads;

a first connector that mechanically connects the first stage to the frame body, the first connector being configured to be bendable on a second line that is parallel to the first line and to be distanced from the first line, and a second connector that mechanically connects the second stage to the frame body, the second connector being configured to be bendable on a third line that is parallel to the first line and to be distanced from the first line, wherein the first and second stages are disposed on a fourth line that runs between second opposite corners of the internal region, and wherein the first and second stages are disposed symmetrically to each other with reference to a reflection-symmetric axis that is aligned to the first line.

* * * * *